United States Patent [19]

Utsunomiya et al.

[11] Patent Number: 5,905,291

[45] Date of Patent: May 18, 1999

[54] MISFET SEMICONDUCTOR INTEGRATED CIRCUIT DEVICE

[75] Inventors: Fumiyasu Utsunomiya; Yutaka Saitoh; Naoto Saitoh; Jun Osanai; Haruo Konishi; Masanori Miyagi, all of Chiba, Japan

[73] Assignee: Seiko Instruments Inc., Japan

[21] Appl. No.: 08/503,828

[22] Filed: Jul. 18, 1995

[30] Foreign Application Priority Data

| Jul. 25, 1994 | [JP] | Japan | 6-172811 |
| Jul. 27, 1994 | [JP] | Japan | 6-175799 |
| Sep. 16, 1994 | [JP] | Japan | 6-221489 |
| May 18, 1995 | [JP] | Japan | 7-120036 |

[51] Int. Cl.⁶ .................................................. H01L 29/772
[52] U.S. Cl. ........................... 257/392; 257/316; 257/366; 257/369; 363/60
[58] Field of Search ................................. 257/392, 402, 257/409, 496, 315, 316, 366, 403, 404, 391, 369, 371, 393

[56] References Cited

U.S. PATENT DOCUMENTS

| Re. 35,121 | 12/1995 | Olivd et al. | 363/60 |
| 4,471,373 | 9/1984 | Shimizu et al. | 257/392 |
| 4,488,061 | 12/1984 | Mukawa et al. | 363/60 |
| 4,651,406 | 3/1987 | Shimizu et al. | 29/571 |
| 4,740,714 | 4/1988 | Masaki et al. | 257/392 |
| 4,866,002 | 9/1989 | Shizukuishi et al. | 257/392 |
| 5,006,974 | 4/1991 | Kazerounian et al. | 257/315 |
| 5,081,371 | 1/1992 | Wong | 363/60 |
| 5,285,069 | 2/1994 | Kaibara et al. | 257/392 |
| 5,317,179 | 5/1994 | Chen et al. | 257/315 |
| 5,362,981 | 11/1994 | Sato et al. | 257/371 |
| 5,475,335 | 12/1995 | Merrill et al. | 257/371 |
| 5,495,122 | 2/1996 | Tada | 257/369 |
| 5,497,021 | 3/1996 | Tada | 257/369 |
| 5,499,183 | 3/1996 | Kubatake | 363/60 |

FOREIGN PATENT DOCUMENTS

| 0228387 | 10/1985 | German Dem. Rep. | 257/366 |
| 3107543 | 12/1981 | Germany . | |
| 2633557 | 2/1978 | Japan | 257/392 |
| 0123676 | 10/1978 | Japan | 257/409 |
| 56-162861 | 12/1981 | Japan | 257/392 |
| 57-24567 | 2/1982 | Japan | 257/392 |
| 0006175 | 1/1983 | Japan | 257/366 |

(List continued on next page.)

OTHER PUBLICATIONS

Patent Abstracts of Japan, vol. 11, No. 108 (E–495) Apr. 4, 1987.

Patent Abstracts of Japan, vol. 18, No. 199 (E–1534) Apr. 7, 1994.

Patent Abstracts of Japan, vol. 16, No. 521 (E–1285) Oct. 27, 1992.

Patent Abstracts of Japan, vol. 009, No. 321 (E–367) Dec. 17, 1985.

Patent Abstracts of Japan, vol. 018, No. 120 (E–1516) Feb. 25, 1994.

Patent Abstract of Japan, vol. 008, No. 243 (E–277) Nov. 8, 1984.

Patent Abstract of Japan, vol. 006, No. 205 (E–136) Oct. 16, 1982.

*Primary Examiner*—Tom Thomas
*Assistant Examiner*—David B. Hardy
*Attorney, Agent, or Firm*—Adams & Wilks

[57] ABSTRACT

A semiconductor integrated circuit device comprises at least two MISFETs formed on a semiconductor substrate and connected in series in a diode connection. Each of the MISFETs has a source, a drain, a channel extending between the source and the drain, and a gate disposed over the channel through a gate insulating film. One of the MISFETs has a first threshold voltage, and the other of the MISFETs has a second threshold voltage lower than the first threshold voltage. A portion of the channel of the semiconductor substrate of each of the MISFETs has an impurity concentration equal to or less than $6 \times 10^{14}$ atoms/cc.

9 Claims, 26 Drawing Sheets

U.S. PATENT DOCUMENTS

| | | | |
|---|---|---|---|
| 0231869 | 12/1984 | Japan | 257/409 |
| 0091676 | 5/1985 | Japan | 257/409 |
| 0248256 | 10/1987 | Japan | 257/366 |
| 0110665 | 5/1988 | Japan | 257/392 |
| 0132478 | 6/1988 | Japan | 257/366 |
| 63-132478 | 6/1988 | Japan | 257/366 |
| 1-183844 | 7/1989 | Japan | 257/392 |
| 2-234462 | 9/1990 | Japan | 257/371 |
| 0162771 | 6/1992 | Japan | 257/392 |
| 5-315610 | 11/1993 | Japan | 257/402 |

THRESHOLD VALUE $V_{tM1} > V_{tM2} > V_{tM3} > \cdots \rightarrow V_{tMn-1} > V_{tMn}$ $M_0$ SIZE : $W/L = 20\mu m/5\mu m$ $M_1 \sim M_n$ SIZE : $W/L = 20\mu m/6\mu m$ $C_1 \sim C_n$ : 1.61 P.F
CAPACITANCE
VALUE AREA RATIO OF SECOND IMPURITY
CONCENTRATION REGION DIVIDED
BY WHOLE CHANNEL REGION AREA OF CAPACITANCE ELEMENT
SC1 > SC2 > SC3 > - - - - - > SCn-1 > SCn AREA OF CAPACITANCE ELEMENT
$(SC_1=SC_2=---=SC_a) > (SC_{a+1}=SC_{a+2}=---=SC_b) > --- > (SC_{k+1}=SC_{k+2}=---=SC_n)$
$(a<b<---<k<n)$ AREA OF CAPACITANCE ELEMENT
$SC1 < SC2 < SC3 < ----- < SCn-1 < SCn$ AREA OF CAPACITANCE ELEMENT
$(SC_1 = SC_2 = \cdots = SC_a) < ((SC_{a+1} = SC_{a+2} = \cdots = SC_b) < \cdots < ((SC_{k+1} = SC_{k+2} = \cdots = SC_n)$
$(a < b < \cdots < k < n)$ OXIDE FILM THICKNESS OF CAPACITANCE ELEMENT
$TC1 < TC2 < TC3 < - - - - < TCn-1 < TCn$ OXIDE FILM THICKNESS OF CAPACITANCE ELEMENT
$(TC1=TC2=---=TCa) < ((TCa+1=TCa+2=---=TCb) <---< ((TCk+1=TCk+2=---=TCn)$
$(a<b<---<k<n)$

MISFET SEMICONDUCTOR INTEGRATED CIRCUIT DEVICE

BACKGROUND OF THE INVENTION

The present invention relates to a semiconductor integrated circuit device necessitating a boosted voltage which is boosted from a power source voltage or the like, particularly to a voltage boosting circuit generating the boosted voltage.

Further, the present invention relates to electronic apparatuses to which the semiconductor integrated circuit device is integrated with regard to a method of utilizing the semiconductor integrated circuit device in an electric circuit.

FIG. 28 shows a schematic sectional view of a conventional MOSFET. The MOSFET formed on a semiconductor substrate 4 is constituted by a source 2, a drain 3, a channel 9 between the source 2 and the drain 3, a gate insulating film 8 formed on the channel 9 and a gate 1 and an impurity concentration of the channel 9 is equal to or more than $5 \times 10^{15}$ atoms/cc.

In a voltage boosting circuit using the conventional MOSFET, the threshold is increased by the body effect of the MOSFET by which the voltage boosting efficiency is considerably deteriorated. Further, the higher the desired voltage, the more considerable is an increase in the threshold due to the body effect of the MOSFET and, therefore, a semiconductor integrated circuit device having a voltage boosting circuit with high function, high efficiency and low cost could not be provided.

SUMMARY OF THE INVENTION

The following means are adopted in the present invention to solve the above-mentioned problems.

As a first aspect of a first means, in a voltage boosting circuit in which a plurality of MOSFETs in a diode connection are connected in series, the impurity concentration of a substrate or a well between the source and drain of the MOSFET is reduced by which the extent of a depletion region widening in junctions between the source and drain and between the respective ones thereof and the substrate is enlarged and the elevation of the threshold by the body effect is restrained as much as possible.

As a second aspect of the first means, a plurality of the impurity concentrations are provided to [portions of] the substrate or the well proximate to the source and the drain of the MOSFET.

As a third aspect of the first means, the impurity concentration of [portions of] the substrate or the well proximate to the source and the drain of the MOSFET is reduced.

As a fourth aspect of the first means, the length L of the MOSFET is shortened more at the MOSFETs on the side of later stages in which the body effect is considerable and the short channel effect is positively utilized by which the threshold is lowered more at the MOSFETs on the side of later stage.

As a fifth aspect of the first means, a first gate insulating film and a second gate insulating film are formed on the same channel of the MOSFET.

As a sixth aspect of the first means, a ratio of areas of the first gate insulating film region to the second gate insulating film region is varied.

As a seventh aspect of the first means, the thresholds of the MOSFETs on the side of later stages of the voltage boosting circuit is made lower than the thresholds of the MOSFETs on the side of earlier stages.

As an eighth aspect of the first means, the thresholds of the MOSFET on the side of later stages of the voltage boosting circuit are set to be of a depletion type. Specifically, the thresholds are of a depletion type which is converted into an enhancement type exactly when the thresholds are boosted by the body effect.

As a ninth aspect of the first means, a plurality of the thresholds of the MOSFETs are set ranging from that of the initial stage to that of the final stage of the voltage boosting circuit.

As a tenth aspect of the first means, a plurality of channels having different impurity concentrations in view from a plane are provided to the MOSFETs of the voltage boosting circuit.

As a first aspect of the second means, the capacitances of capacitance elements of respective stages in the voltage boosting circuit are successively reduced from the initial stage to the final stage.

As a second aspect of the second means, the voltage boosting circuit is divided into blocks each including a stage or more, the capacitances of the capacitance elements in each block stay constant and the [blockwise] capacitances of the capacitance elements are successively reduced from the blocks on the side of earlier stages to the blocks on the side of later stages.

As a first aspect of the third means, the capacitances of the capacitance elements of the respective stage of the voltage boosting circuit is successively increased from the initial stage to the final stage.

As a second aspect of the third means, the voltage boosting circuit is divided into blocks each including a stage or more, the capacitances of the capacitance elements in each block stay constant and the [blockwise] capacitances of the capacitance elements are successively increased from the blocks on the side of earlier stages to the blocks on the side of later stages.

As a fourth means, a signal voltage boosting circuit which elevates a wave height value of a clock signal that is an input signal inputted to the voltage boosting circuit is added to the voltage boosting circuit.

As a fifth means, the voltage boosting circuit of either one of the first through the fourth means or both of these is mounted on a semiconductor integrated circuit device having an electrically rewritable unvolatile memory element.

As a sixth means, the voltage boosting circuit of the second means is mounted on a semiconductor integrated circuit device having an electrically rewritable unvolatile memory element.

As a seventh means, the voltage boosting circuit of the third means is mounted on a semiconductor integrated circuit device having an electrically rewritable unvolatile memory element.

As a first aspect of an eighth means, an electroluminescence element is connected to a semiconductor integrated circuit device incorporating the voltage boosting circuit of either one of the first, the second and the fourth means, or two or three of all the means and the electroluminescence element is driven by the voltage boosting circuit.

As a second aspect of the eighth means, two of the voltage boosting circuits of either one of the first, the second and the fourth means, or two or three of all the means are utilized for driving the electroluminescence element wherein boosted outputs are alternately applied on both sides of the electroluminescence element.

The following operations are provided by adopting the above-mentioned means.

By adopting the first means, the amount of lowering the boosted voltage of the voltage boosting circuit due to the elevation of the threshold value caused by the body effect of the MOSFET in the voltage boosting circuit can be reduced and, therefore, a voltage boosting circuit capable of boosting the voltage to a high voltage (for example 20 V) which has not been possible to provide without using a signal boosting circuit even in case where the power source voltage is low (for example 0.9 V), can be realized.

By adopting the second means, the amount of elevation of the boosted voltage with respect to a number of supply of clock signals in the voltage boosting circuit is increased and a voltage boosting circuit having a necessary voltage boosting speed which has not been possible to provide can be realized without increasing the frequency of clock signals even with a low power source voltage. Further, in case where the capacitance is changed by changing an oxide film thickness of a capacitance element while maintaining the area of the capacitance element constant, the later the stages of the capacitance elements on which high voltages are applied, the thicker the oxide film thickness can be formed and, therefore, a voltage boosting circuit in which the voltage resistance of the capacitance element is higher than the conventional one can be realized.

By adopting the third means, the amount of elevation of the boosted voltage with respect to the number of times of supply of clock signals in the voltage boosting circuit is reduced and a voltage boosting circuit in which the voltage boosting speed is retarded which has not been possible to provide can be realized without a circuit having a function of retarding the voltage boosting speed even in a case where the power source voltage is high.

By adopting the fourth means, the wave height value of the clock signal is boosted and, therefore, the boosted voltage and the voltage boosting speed in the voltage boosting circuit can be increased whereby a voltage boosting circuit providing a desired boosted voltage can be realized even when the power source voltage is low or when the desired boosted voltage is high.

By adopting the fifth means, a semiconductor integrated circuit device having an electrically rewritable unvolatile memory element can be operated by a lower power source voltage.

By adopting the sixth means, a semiconductor integrated circuit device having an electrically rewritable unvolatile memory element capable of operating at a high speed which has not been possible to provide even if the power source voltage is low and also consuming a low current can be realized.

By adopting the seventh means, a semiconductor integrated circuit device having an electrically rewritable unvolatile memory element having no increase in the occupied area which has not been possible to provide even when the power source voltage is high and also having a long life can be realized.

By adopting the eighth means, an electronic apparatus having a light emitting apparatus utilizing the light emitting characteristic of a thin-type and highly bright electroluminescence element that has not been capable to provide can be realized.

DETAILED DESCRIPTION OF THE PREFERRED EMBODIMENTS

An explanation will be given of embodiments of the present invention with reference to the drawings. Although not especially restricted, the method of manufacturing the embodiments shown here uses a method of forming it on a single semiconductor substrate such as a silicon substrate by a publicly-known semiconductor integrated circuit manufacturing technology and an explanation will be given to a case where respective elements are formed on a P-type semiconductor substrate although not especially restricted.

Figure 1:
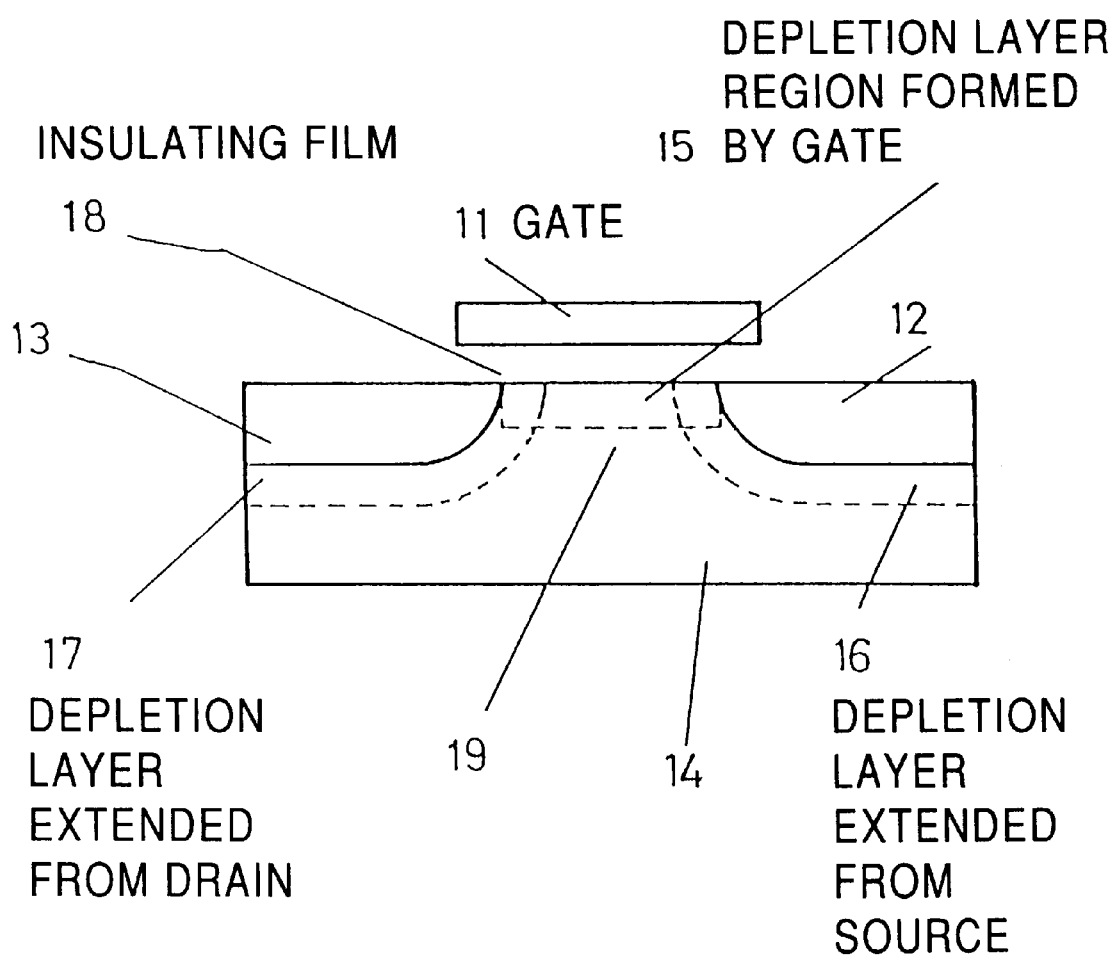
FIG. 1 is a schematic sectional view showing a sectional structure of a MOSFET of a first embodiment of the present invention.

FIG. 1 is a schematic sectional view showing a sectional structure of a MOSFET of a first embodiment according to the present invention. A depletion region widening from junctions between a source 12 and a drain 13, and a semiconductor substrate 14 (a well in case where the MOSFET is formed in the well) is apt to be widened with a thinner concentration of the semiconductor substrate (or well). Therefore, in this embodiment, the concentration of the semiconductor substrate (or well) or the concentration of [portions of] the semiconductor substrate (or well) in the vicinities of the source 12 and the drain 13 is rendered as low as $6 \times 10^{14}$ atoms/cc, the extent of the depletion region extending from the source 12 and the drain 13 is enlarged and the amount of burden of a channel 19 by the widening of the depletion region is increased by which a voltage applied on the gate which is necessary for forming the channel is reduced and the elevation of the threshold caused by the body effect can be restrained.

Figure 2:
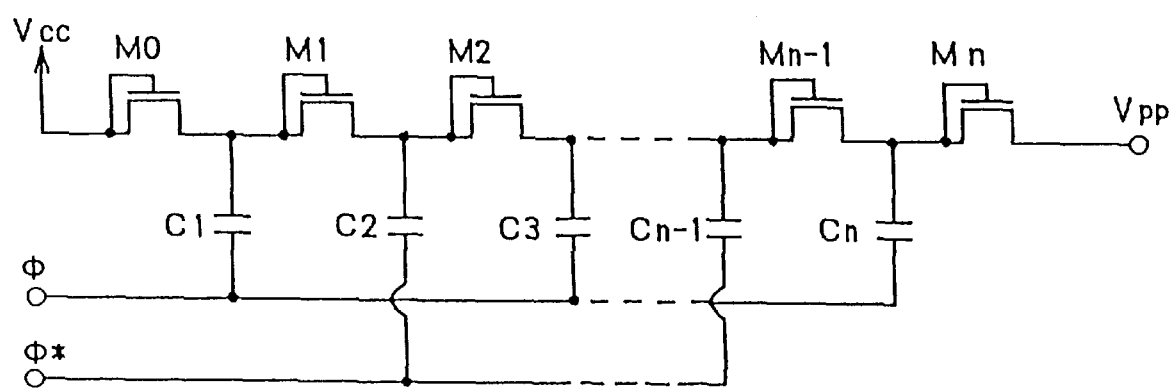
FIG. 2 is a circuit diagram showing a voltage boosting circuit of a second embodiment of the present invention.
Figure 3:
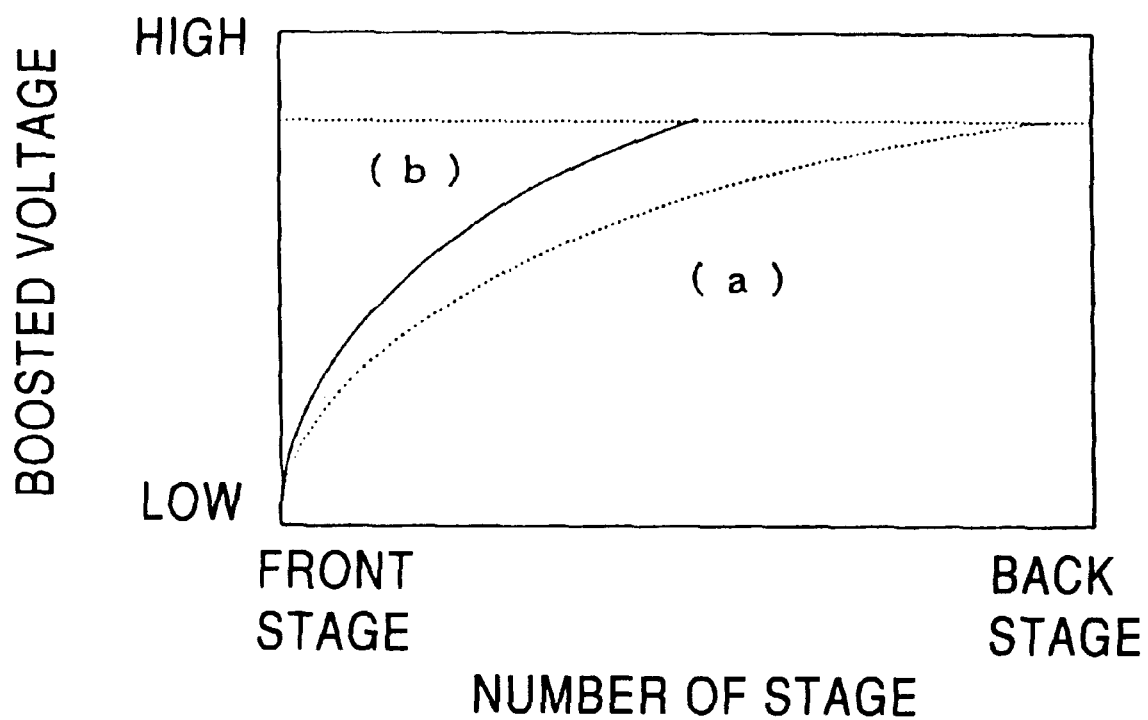
FIG. 3 shows a graph showing a number of steps of a voltage boosting circuit and a boosted voltage at that time in a second embodiment of the present invention invention.

FIG. 2 is a circuit diagram of a voltage boosting circuit of a second embodiment according to the present invention. Further, FIG. 3 is a diagram showing relationships between a number of steps of the voltage boosting circuit of the second embodiment and a number of steps of a voltage boosting circuit using conventional MOSFETs and the boosted voltage.

A plurality of MOSFETs are connected in series wherein each drain and each gate is connected by the same node and capacitance elements C1 through Cn are respectively connected to the nodes to which the respective MOSFETs are connected. Signals having mutually deviated phases Φ and Φ* are alternately applied on one-side electrodes of every other capacitance elements. By successively transferring electric charge from the capacitance C1 to the capacitance Cn, Vpp which is a boosted voltage higher than a power source voltage Vcc is outputted from the MOSFET Mn. Here, a pair of Ma and Ca is defined as a voltage boosting unit of stage a and the number of the voltage boosting units in the voltage boosting circuit is defined as a number of stages of the voltage boosting circuit.

In this case, when the MOSFETs M1 through Mn have the same threshold, a substantial threshold is boosted by the body effect as for the later stages and therefore, lowering of the source voltage as compared with the drain voltage is gradually enhanced. That is, the efficiency of the voltage boosting circuit is deteriorated more in the later stages. A graph (a) in FIG. 3 shows a relationship between the number of stages and the boosted voltage when the voltage boosting circuit is constituted as above.

In this embodiment, the MOSFETs M1 through Mn are constructed by the MOSFETs having the structure of the first embodiment such that the thresholds are difficult to receive the influence of the body effect. A graph (b) in FIG. 3 is a graph determined by the number of steps and the boosted voltage when the voltage boosting circuit is constituted as above. As is apparent from the figure, the voltage elevation to a desired voltage is made possible even with the fewer number of steps.

Or, the substrate concentrations or the well concentrations of the MOSFET M1 through Mn are constructed such that the thresholds are lowered more at the later stages. (The substrate concentration and the well concentration here are not restricted to the total of the region. It may be a value [of portions thereof] in the vicinity of the source and the drain.) The lowering of the source voltage as compared with the drain voltage in each stage can be restrained and the efficiency of the voltage boosting circuit is considerably enhanced. Further, the thresholds of all the MOSFETs may not be different and the thresholds may be changed at every several stages by dividing them in several blocks.

Figure 4A:
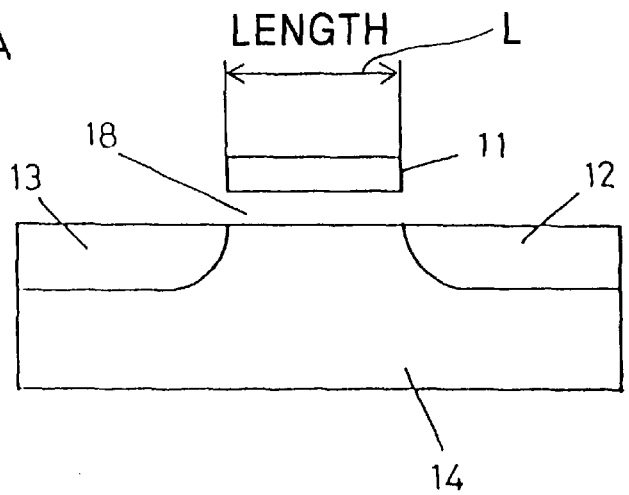
FIG. 4A is a schematic sectional view showing a portion of a length L of a MOSFET in a third embodiment of the present invention.

Further, FIG. 4A is a schematic sectional view showing a portion having a length L of a MOSFET in a third embodiment of the present invention wherein numerals of respective component elements are the same as those in FIG. 1.

Figure 4B:
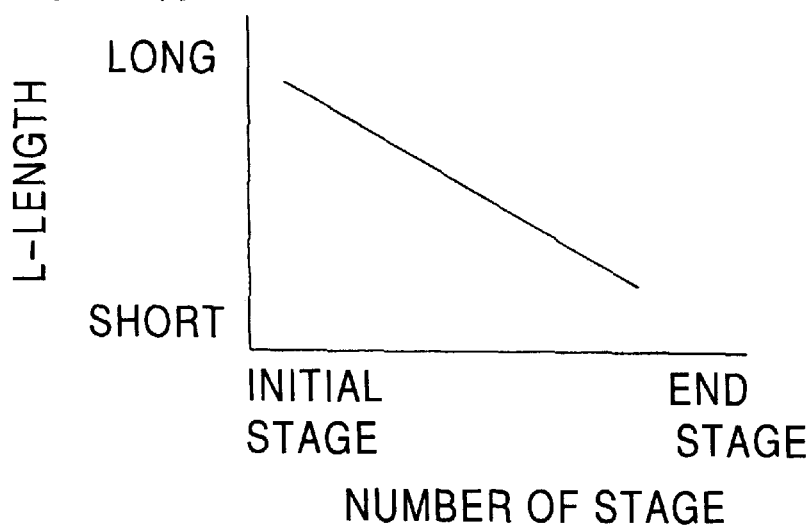
FIGS. 4B and 4C are views showing the length L corresponding to a number of steps when the MOSFET of the third embodiment of the present invention is used in a voltage boosting circuit.
Figure 4C:
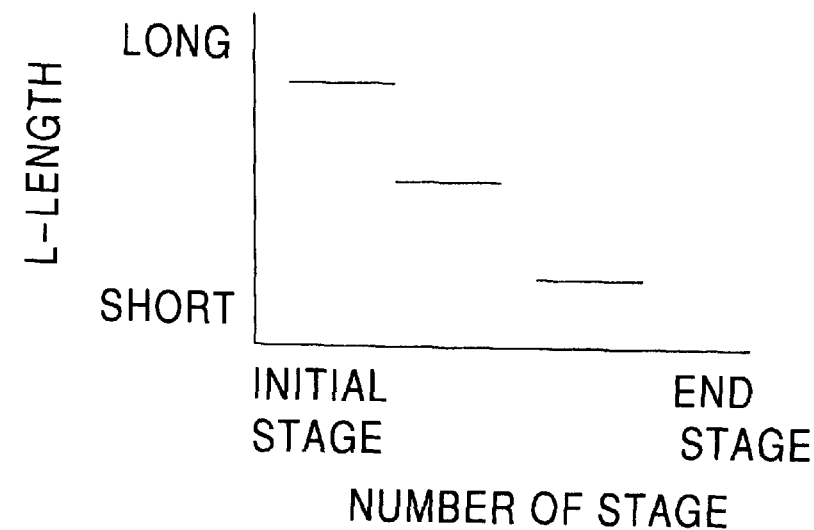

FIGS. 4B and 4C are diagrams each showing a relationship between the number of steps and the length L of the MOSFET when the MOSFETs of the third embodiment are utilized in a voltage boosting circuit. By changing the length L specified in FIG. 4A in accordance with stages from earlier stages to later ones as shown in FIGS. 4B and 4C, the lowering of source voltage as compared with drain voltage in each stage is restrained and the efficiency of the voltage boosting circuit is considerably increased.

Figure 5:
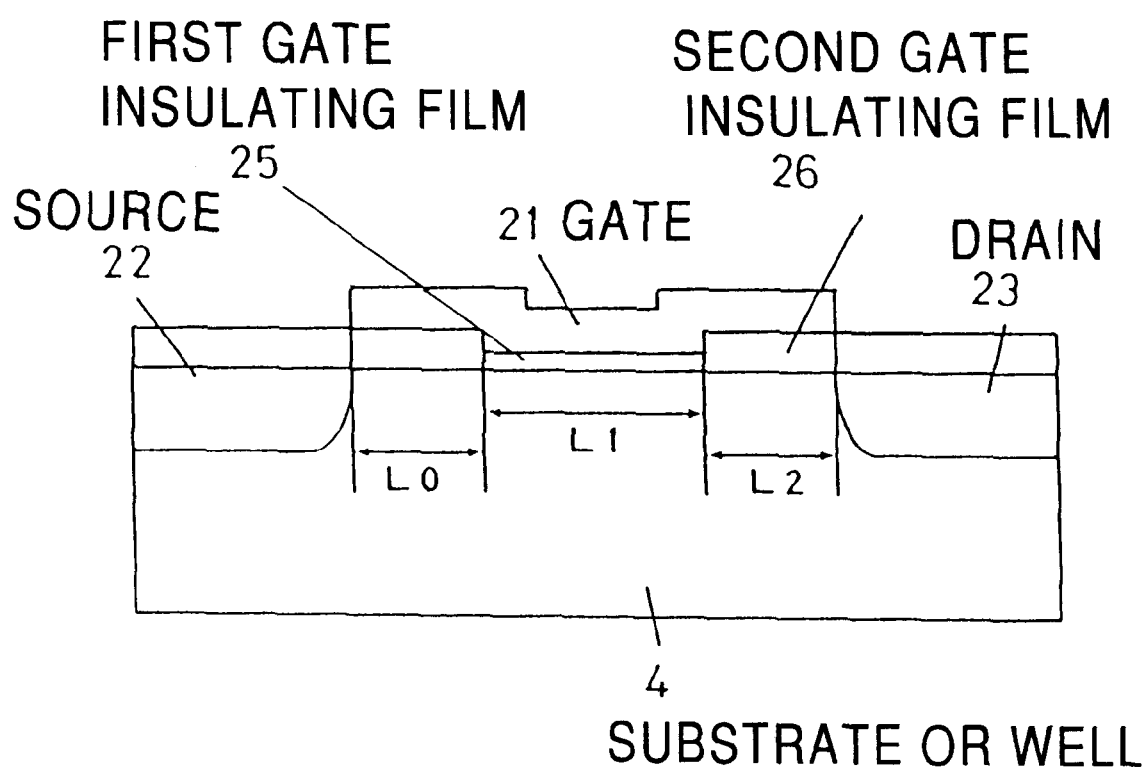
FIG. 5 is a schematic sectional view showing a sectional structure of a MOSFET of a fourth embodiment of the present invention.

FIG. 5 is a schematic sectional view showing a sectional structure of a MOSFET of a fourth embodiment of the present invention. A gate insulating film has two different film thicknesses on a channel and the threshold can be controlled by the respective film thicknesses of a first gate insulating film 25 and a second gate insulating film 26 and a ratio of areas occupied by respective regions of the first gate insulating film 25 and the second gate insulating film 26. Although the film thickness at the central portion of the gate insulating film is thinned in FIG. 5, that at the peripheral portion may be thin and that at the central portion may be thickened. There is no restriction over which portion of the gate insulating film is to be thick and which portion thereof is to be thin.

Figure 6A:
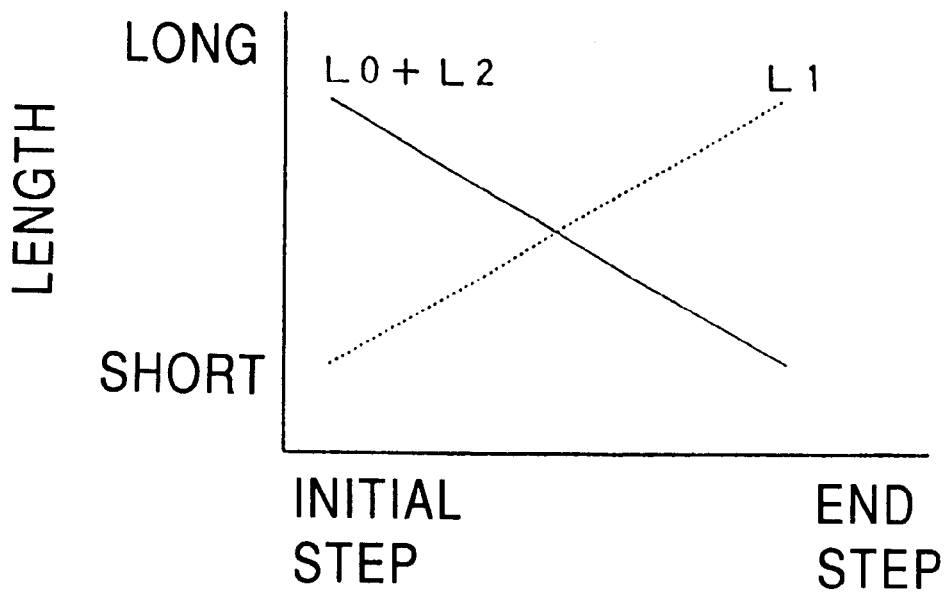
FIG. 6A is a view showing a length of a gate insulating film corresponding to a number of steps of a voltage boosting circuit when a MOSFET of a fourth embodiment of the present invention is utilized in the voltage boosting circuit.
Figure 6B:
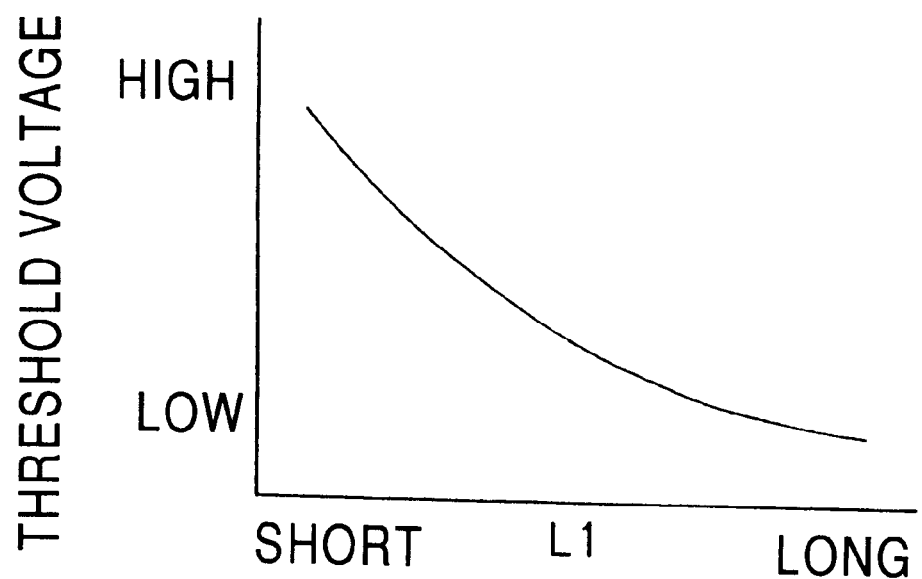
FIG. 6B is a view showing a change of a threshold of the MOSFET when L1 is changed.

Further, FIG. 6A shows a relationship among the number of steps of the MOSFETs, the length of the first gate insulating film L1 and the length of the second gate insulating film (L0+L2) when the MOSFET of the fourth embodiment is employed in the voltage boosting circuit and FIG. 6B shows a change of the threshold value of the MOSFET when the above-mentioned L1 is changed. In this way, the control of the threshold value can easily be performed by enlarging the length of the first gate insulating film and by shortening the length of the second gate insulating film, that is, by changing the ratio of areas of the first gate insulating region and the second gate insulating film region as the stages proceed to later ones.

Figure 7:
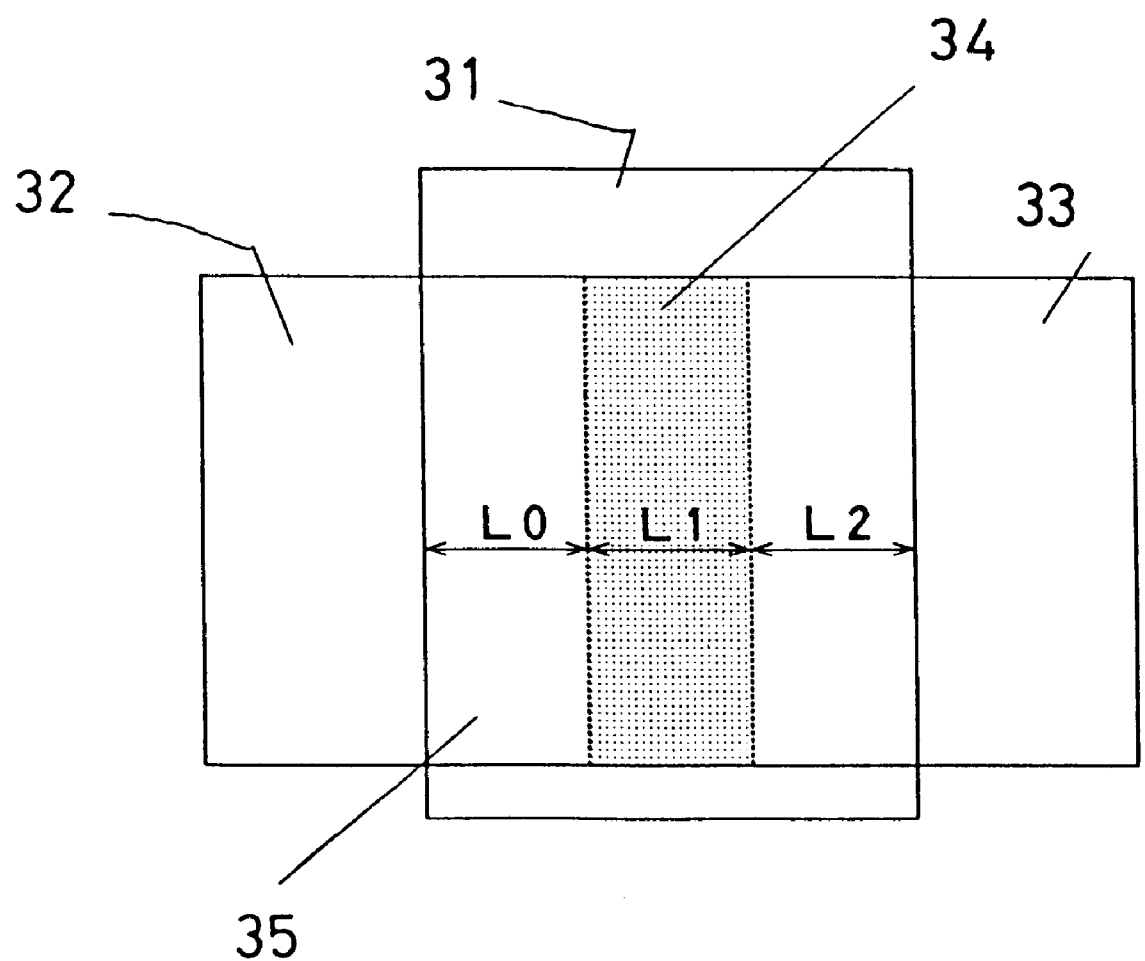
FIG. 7 is a schematic plane view showing a plane structure of the MOSFET of the fourth embodiment of the present invention.

Further, FIG. 7 is a schematic plane view of a MOSFET of the fourth embodiment of the present invention. A first gate insulating film region 34 and a second gate insulating film region 35 are formed in a gate insulating film of a gate 31 disposed between a source 32 and a drain 33. As mentioned above, the film thickness of the gate insulating film may be thick or thin at any portion.

Figure 8:
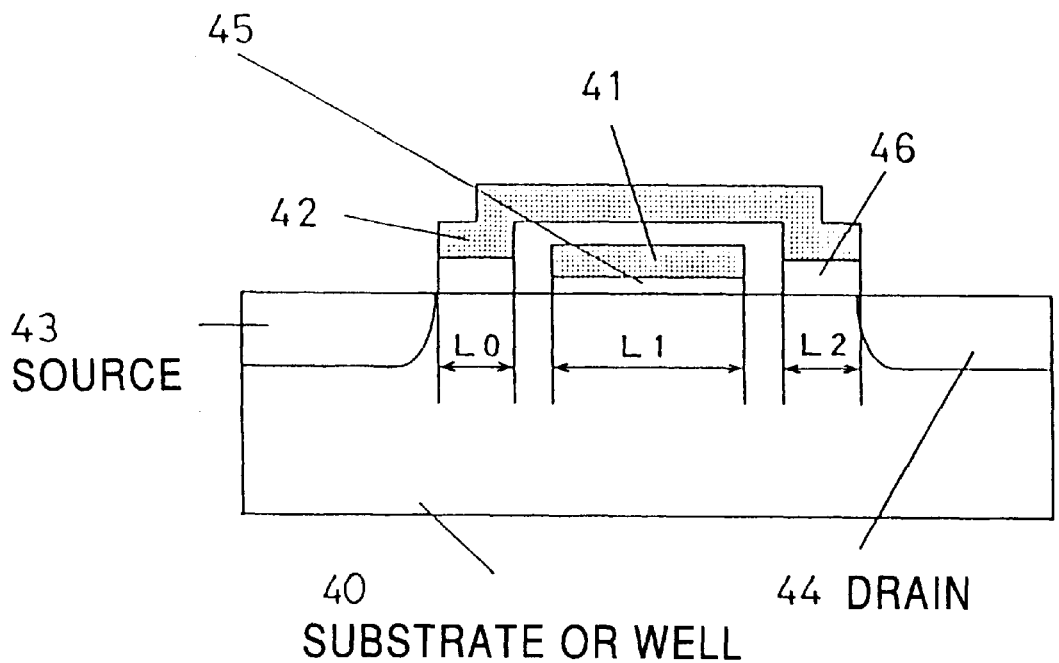
FIG. 8 is a schematic sectional view showing a sectional structure of a MOSFET of a fifth embodiment of the present invention.

FIG. 8 is a schematic section view showing a sectional structure of a MOSFET of a fifth embodiment of the present invention. In this example, a first gate 41 is formed on a first gate insulating film 45, a second gate 42 is formed covering a second gate insulating film 46 and the first gate 41 and the second gate 42 are separately formed. It is easy to render the gate of the MOSFET to be a gate having two layers as shown in FIG. 8 in a voltage boosting circuit mounted on an unvolatile semiconductor memory device using two layers of gate electrodes. Here, the thresholds can be controlled by the respective film thicknesses of the first gate insulating film 45 and the second gate insulating film 46 beneath the first gate 41 and the second gate electrode 42 and a ratio of areas occupied by the respective region of the first gate insulating film 45 and the second gate insulating film 46.

An efficient voltage boosting circuit can be formed by changing L1 and L0+L2 in accordance with the number of steps as shown in FIGS. 6A and 6B as in the fourth embodiment. Further, although the gate insulating film beneath the first gate is thin and the gate insulating film beneath the second gate is thick in FIG. 8, they may be reversed. It is not necessary that all the portions beneath the first gate is occupied by the first gate insulating film. Naturally, it is also not necessary that all the portions beneath the second gate is occupied by the second gate insulating film. Further, it is not necessary that all the portions beneath the first gate is covered with the second gate.

Figure 9:
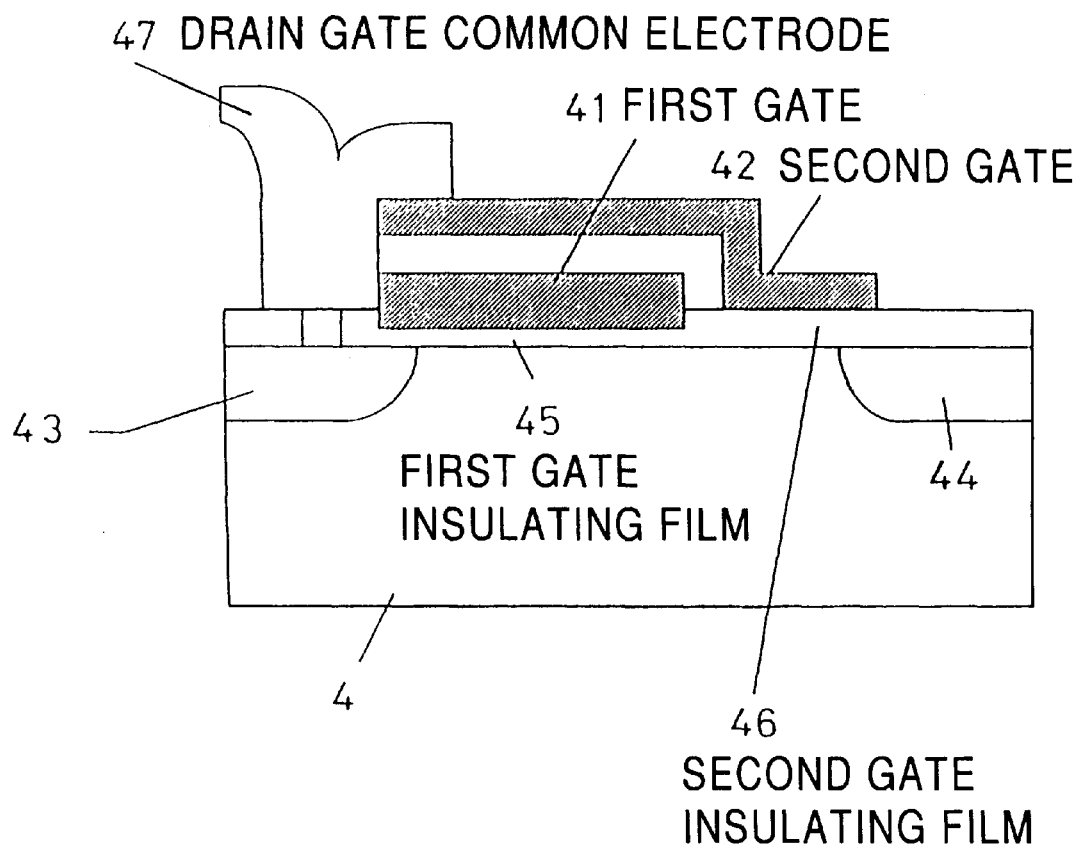
FIG. 9 is a schematic sectional view showing a sectional structure of a MOSFET of a sixth embodiment of the present invention.

FIG. 9 is a schematic sectional view showing a sectional structure of another MOSFET of a sixth embodiment of the present invention. In FIG. 9, numerals of respective component elements are common to those in FIG. 8. In the voltage boosting circuit, the gate and the drain are at the same potential and therefore, the side wall of the gate and the upper face of the drain can be connected by an aluminum wiring as a drain/gate common electrode 47 as shown in the figure. The element can be miniaturize by a space of wiring by forming the common aluminum wiring. As a result, the chip area can be reduced. Naturally, the simultaneous aluminum wiring on the side wall of the gate and the upper face of the drain is not naturally restricted to the case of two layers of polycrystal silicon. It is applicable also in case of one layer thereof.

Figure 10:
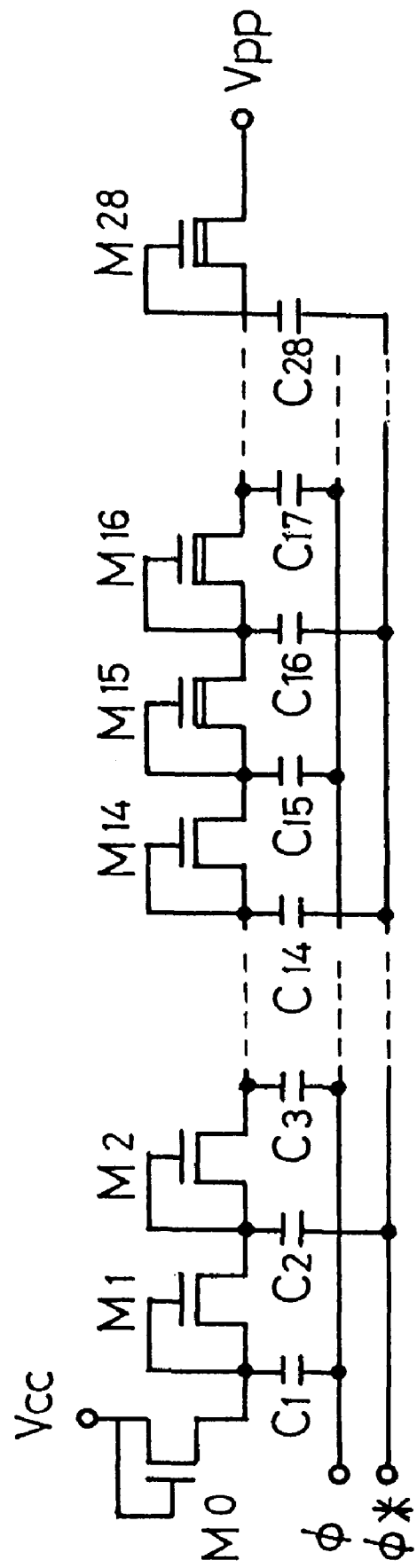
FIG. 10 is a circuit diagram of a voltage boosting circuit of a seventh embodiment in the present invention.

FIG. 10 is a circuit diagram of a voltage boosting circuit of a seventh embodiment of the present invention. In FIG. 10, MOSFETs M0 through M14 utilize MOSFETs of an enhancement type wherein the threshold value is proximate to 0 V (approximately 0.05 V in the embodiment) and M15 through M28 utilize MOSFETs of a depletion type wherein the thresholds are approximately −0.5 V. The drain and the gate of M0 are connected to a power source voltage Vcc and when the above-mentioned clock signals Φ and Φ* are applied thereon, electric charge supplied from the power source via M0 is successively transferred to later stages and a voltage Vpp (approximately 20 V in the embodiment) higher than the power source voltage Vcc is finally outputted to the source of M28.

Figure 11:
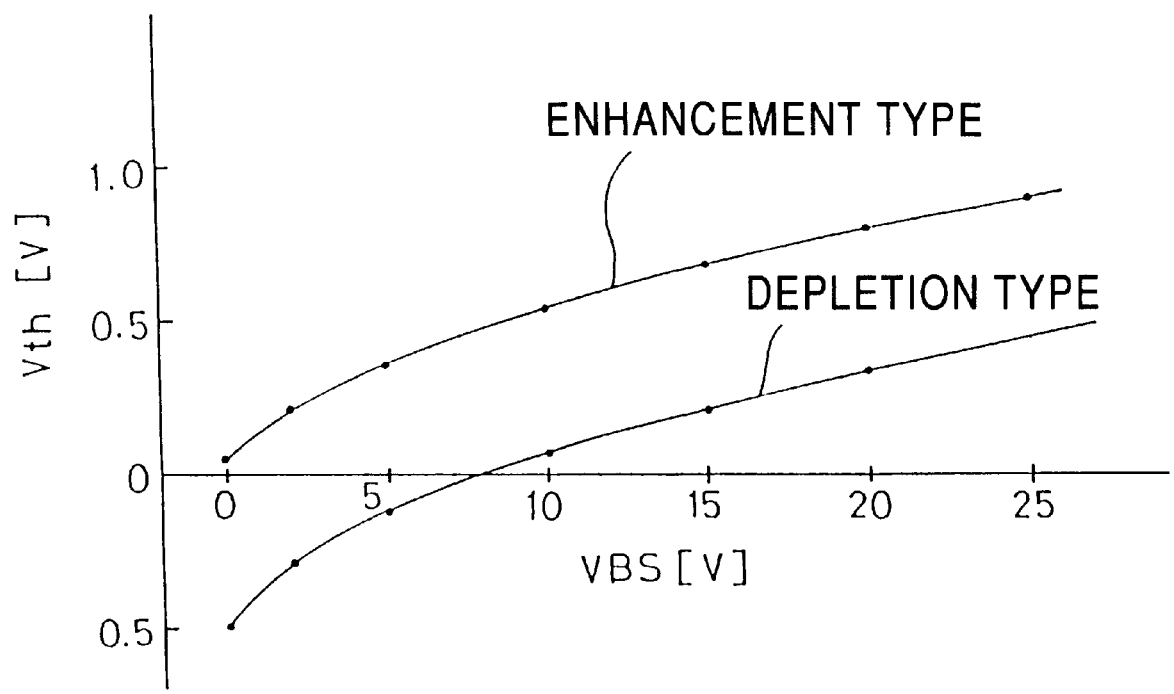
FIG. 11 shows graphs indicating a VBS dependency of a threshold of the MOSFET constituting the voltage boosting circuit of the seventh embodiment in the present invention.

FIG. 11 shows a dependency of the threshold of a MOSFET utilized in the embodiment on a difference VBS between voltages of the source and the substrate. It is known in case of the enhancement type MOSFET that the threshold Vth is boosted to 0.8 V when VBS is 20 V.

That is, when the voltage boosting circuit is constituted only by the enhancement type MOSFETs, the boosted voltage output of 20 V or more cannot be provided unless the wave height value of the clock signal is at least 0.8 V. Therefore, by utilizing the depletion type MOSFETs having the threshold value of proximately −0.5 V at a stage in which VBS is approximately 10 V and later stages (No. 15 stage and later stage in this embodiment) a sufficient boosted voltage output (20 V in this embodiment) can be provided even by using a lower wave height value of the clock.

Figure 12:
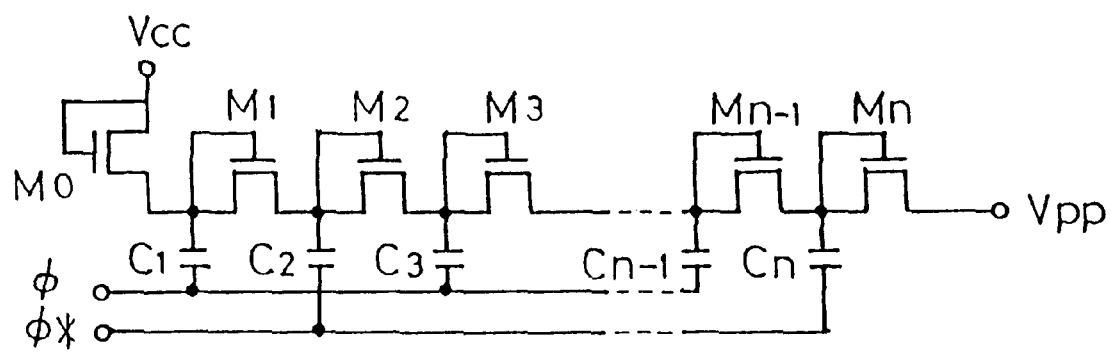
FIG. 12 is a circuit diagram of a voltage boosting circuit of an eighth embodiment in the present invention.

FIG. 12 is a circuit diagram of a voltage boosting circuit of an eighth embodiment according to the present invention.

Figure 13:
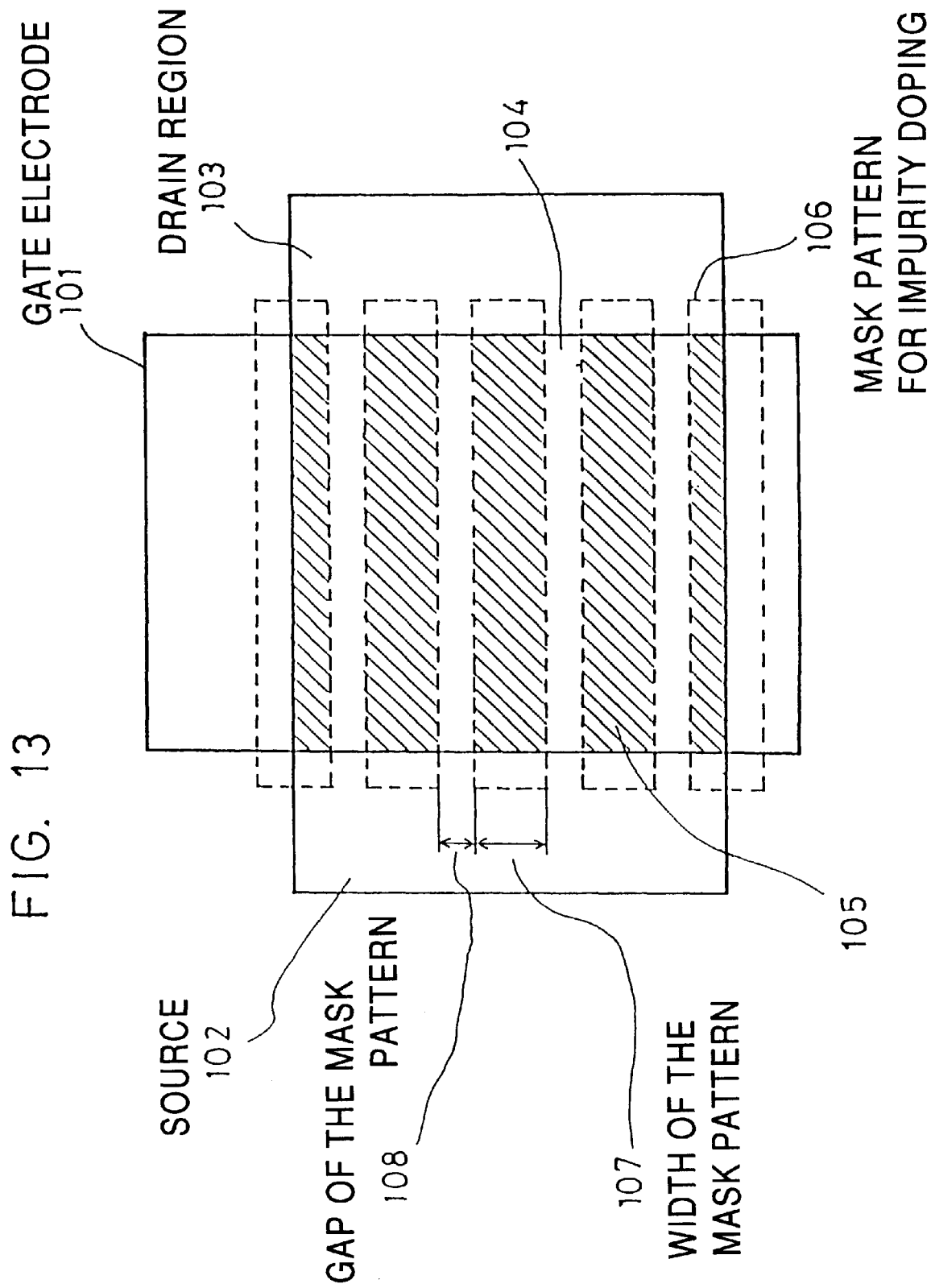
FIG. 13 is a schematic plane view of the MOSFET constituting the voltage boosting circuit of the eighth embodiment in the present invention.

FIG. 13 shows a schematic plane view of a MOSFET wherein a channel is formed between a source 102 and a drain 103 and a gate 101 is formed on the channel via a gate insulating film (omitted in FIG. 5). This channel includes a plurality of channels having different impurity concentrations which are separated into a channel 104 having a first impurity concentration and a channel 105 having a second impurity concentration by a mask pattern 106 for introducing impurity and its width 107 and its interval 108 of mask pattern are determined by the mask pattern for introducing impurity.

In FIG. 12 of this embodiment MOSFETs M11 through Mn have a structure wherein the channel includes two kinds of impurity concentrations as shown in FIG. 13. Although not especially restricted, specifically, the channel 104 having the first impurity concentration is in a native state which is determined by the concentration of a P-type semiconductor substrate and the threshold becomes approximately 0.05 V when all the area of the channel has the first impurity concentration. Further, phosphorus (P) is introduced into the channel 105 having the second impurity concentration as the impurity under a condition of 50 KeV and $2.2 \times 10^{11}$ cm$^{-2}$ through $3 \times 10^{11}$ cm$^{-2}$ forming a depletion type one. Further, the threshold of the MOSFET having such a structure is determined by a ratio of areas and shapes of the channel 104 having the first impurity concentration and the channel 105 having the second impurity concentration.

Figure 14:
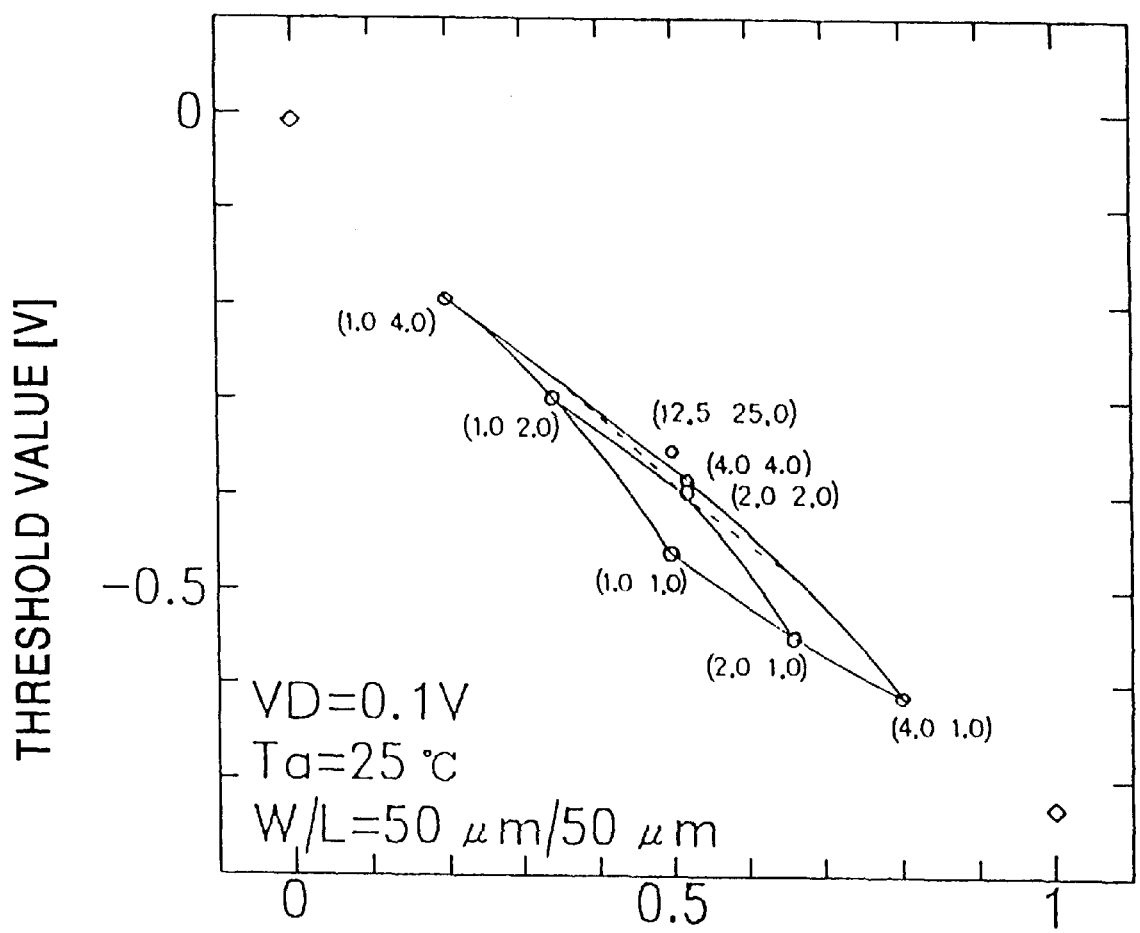
FIG. 14 shows graphs showing a relationship between a ratio of areas of a channel having a second impurity concentration to all the channels of the MOSFET constituting the voltage boosting circuit of the eighth embodiment in the present invention and a threshold.

Although the channel 105 having the second impurity concentration is formed in a strip-like shape in parallel with the length direction of the channel, the channel 105 having the second impurity concentration may be formed in a strip-like shape in parallel with the width direction of the channel or in a dot-like shape or in a check-pattern-like shape although not especially illustrated here. FIG. 14 shows graphs wherein the axis of abscissa is a ratio of areas of the channel 105 having the second impurity concentration to all the channels of the MOSFET shown in FIG. 13 and the axis of ordinate is the threshold. Left ones of numerical values in parentheses in the graphs denote the width of the channel 105 having the second impurity concentration and right ones denote the interval which are respectively indicated by the unit of $\mu$m.

Further, the threshold value of the MOSFET in case where the ratio of areas of the channel 105 having the second impurity concentration to all the channels is 0 or 1, that is, that of the MOSFET in the native stage and that of the MOSFET in a stage in which the channel 105 having the second impurity concentration occupies the total face, are denoted by diamond dots. As is apparent from FIG. 14, the larger the ratio of areas of the channel 105 having the second impurity concentration to all the channels, the lower becomes the threshold.

In this embodiment, attention is paid to the above-mentioned fact and the channel 105 having the second impurity concentration is increased in the ratio of areas and shapes such that the depletion of the thresholds VtM1 through VtMn of the MOSFETs M1 through Mn shown in FIG. 12 becomes deeper, that is, the thresholds become lower as the stages proceeds to later ones. Although not especially restricted, the thresholds at the respective stages may be set at depletion [values] to a degree wherein the thresholds becomes exactly those of the enhancement type due to the body effect at the respective stages during the boosting circuit operation. In this way, a more efficient voltage boosting circuit can be provided and the voltage boosting circuit can be formed at a low cost since only one step of introducing impurity is necessary whereas steps of introducing impurity for kinds of Vth's other than Vth's of an enhancement type have been necessary in the conventional case.

Further, the MOSFETs of the depletion type at the later stages of the voltage boosting circuit of the embodiment 7 may be formed by the structure comprising the channels having two kinds of impurity concentrations as shown in FIG. 13 and by the method of changing the ratio of areas or shape of the channels having two kinds of impurity concentrations.

Figure 15:
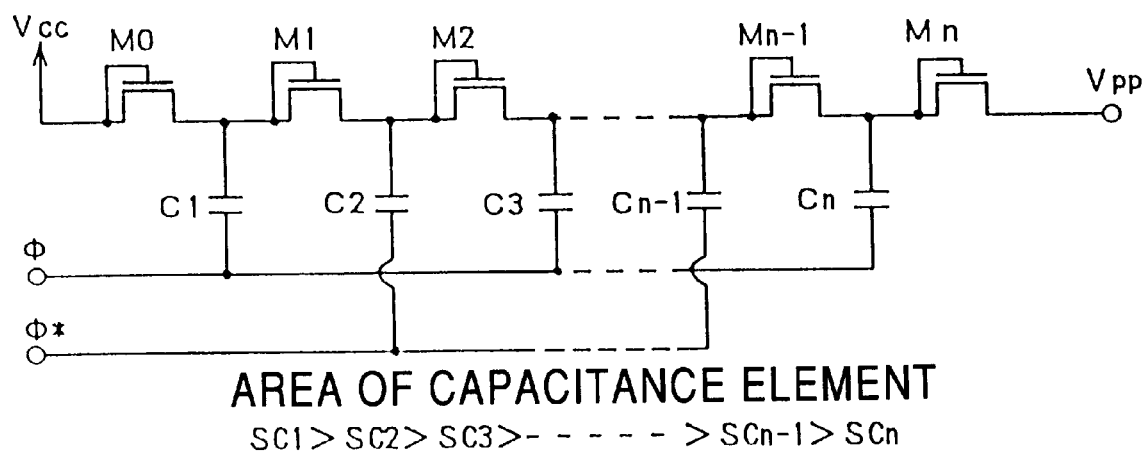
FIG. 15 is a circuit diagram of a voltage boosting circuit of a ninth embodiment in the present invention.

FIG. 15 shows a circuit diagram of a voltage boosting circuit of a ninth embodiment according to the present invention.

As stated above, in the voltage boosting circuit the boosted voltage Vpp higher than the power source voltage Vcc is generated by successively transferring electric charge that is charged successively to the capacitance elements to later stages via the MOS diodes by using the clock signals Φ and Φ*. That is, the maximum boosted voltage Vpp can not be generated instantaneously but the boosted voltage Vpp is increased with an increase in the number of times whereby the clock signals Φ and Φ* are supplied and finally it is saturated to the maximum boosted voltage Vpp. In a semiconductor integrated circuit device wherein this voltage boosted circuit is integrated to the inside thereof, the voltage boosting circuit is operated only when the boosted voltage Vpp is necessary by which the boosted voltage Vpp is generated and an aimed action is performed by using the generated boosted voltage Vpp.

For example, in a semiconductor integrated circuit device having an unvolatile memory element, the voltage boosting circuit incorporated in the circuit is operated in rewriting the unvolatile memory element and the unvolatile memory element is rewritten by the generated boosted voltage Vpp. Accordingly, when the voltage boosting speed of the voltage boosting circuit is retarded, the speed of rewriting the unvolatile memory element, in other words, the operating speed of the semiconductor integrated circuit device having the unvolatile memory element is retarded. Especially in case where the power source voltage is lowered, the power source voltage Vdd of the voltage boosting circuit and the wave height values of the clock signals Φ and Φ* are decreased by which the voltage boosting speed is lowered and therefore, the lowering of the operating speed is significant.

In the above-mentioned voltage boosting circuit, electric charge generated by increasing a voltage of a stage wherein the clock signal is at high level by the wave height value of the clock signal, is transported to a capacitance element of a succeeding stage via a MOSFET in a diode connection of the stage until a voltage of the succeeding stage becomes a voltage Vc having a value of the voltage of the preceding stage subtracted by a threshold Vthi of the MOSFET of i-th stage that is boosted by the body effect. That is, by repeating this action the voltage of the succeeding stage is kept boosting and as a result, the voltage outputted from the final stage is boosted. Therefore, the higher the above-mentioned Vc, the more boosted is the voltage boosting speed. The above-mentioned Vc is expressed by the following equation.

$$Vc=[(V_i-Vth_i)Cc_i+V_{i+1}*Cc_{i+1}]/(Cc_i+Cc_{i+1})$$

where Cci is a capacitance of a capacitance element of i-th stage, Vi is a voltage of i-th stage at the instance when the clock signal is at high level, $Cc_{i+1}$ is a capacitance of a capacitance element of i+1-th stage, $V_{i+1}$ is a voltage of i+1th stage at the instance when the clock signal is at low level and Vthi is a threshold of the MOSFET of i-th stage.

It is known from this equation that the voltage rise Vc at the succeeding stage is determined by the value of the capacitance $Cc_{i+1}$ of the capacitance element of i+1-th stage in relation to the capacitance of $Cc_i$ of the capacitance element of i-th stage. In other words, the smaller set the capacitance $Cc_{i+1}$ of the capacitance element of i+1-th stage as compared with the capacitance $Cc_i$ of the capacitance element of i-th stage, the faster becomes the voltage boosting speed of the voltage boosting circuit, and conversely, the larger set the value, the lower becomes the voltage boosting speed. Further, the lower becomes the threshold value $Vth_i$ of the MOSFET of i-th stage, the more boosted is the voltage boosting speed.

In the voltage boosting circuit of this embodiment, attention is paid to the fact that the voltage boosting speed is changed by the value of the capacitance $Cc_{i+1}$ of the capacitance element of i+1-th stage as compared with the capacitance $Cc_i$ of the capacitance element of i-th stage and the capacitances of the capacitance elements of the respective stages are decreased successively from the earlier stages to the later stages by decreasing areas Sci of the capacitance elements successively from the earlier stages to the later stages ($Sc_1>Sc_2>Sc_3 \ldots >Sc_{n-1}>Sc_n$) while fixing the film thicknesses of oxide films which are the insulating films of the capacitance elements of the respective stages. In this way the voltage boosting speed of the voltage boosting circuit can be increased. Although not especially restricted, with regard to the design value of the respective portions of the voltage boosting circuit in this embodiment, it is recommended that when the voltage is boosted from the power source voltage 0.9 V to 20 V, the number of stages is 24, the thickness of the oxide films of the capacitance elements is 50 nm and with regard to the areas of the capacitance elements of the respective stages, the area of the capacitance element at the initial stage is 5000 $\mu m^2$ and the areas of the capacitance elements of the second stage and the later stages each has a value of the area of the capacitance element at the preceding stage of the each stage subtracted by 10% of the area of the capacitance element at the preceding stage.

Further, attention is paid to the fact that the lower the threshold value Vthi of the MOSFET of i-th stage, the more boosted is the voltage boosting speed and the voltage boosting speed of the voltage boosting circuit can be more increased and also the boosted voltage can be increased by determining the threshold values of the MOSFETs of the respective stages in accordance with either one of the second through the eighth embodiments in addition to the above-mentioned structure of the capacitance elements of the respective stage.

Figure 16:
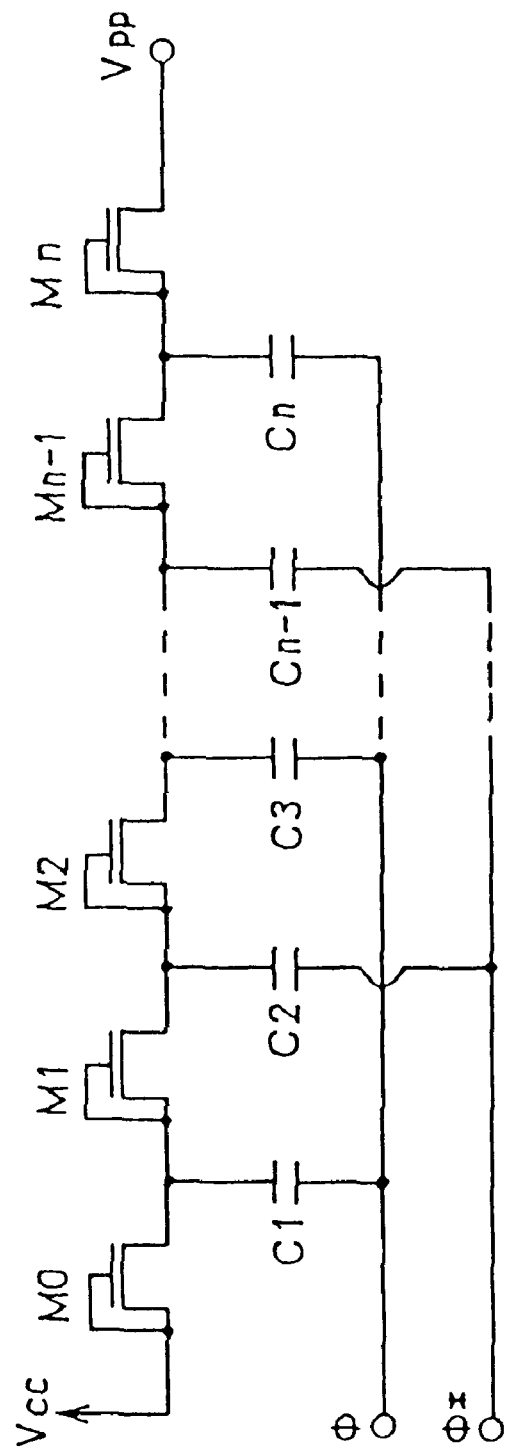
FIG. 16 is a circuit diagram of a voltage boosting circuit of a tenth embodiment in the present invention.

FIG. 16 shows a circuit diagram of a voltage boosting circuit of a tenth embodiment according to the present invention.

While the film thicknesses of the oxide films that are the insulating films of the capacitance elements of the respective stage are maintained constant, the elements are divided into blocks each having one-stage or more wherein the capacitances of the capacitance elements included in the block are same with each others and the capacitance of the capacitance elements in the blocks are decreased successively from the blocks at the earlier stages to the blocks at the later stages by decreasing the area Sci of the capacitance elements in the block successively from the blocks at the earlier stages to the blocks at the later stages as shown by the following equation.

$$(Sc_1=Sc_2=\ldots=Sc_a)>(Sc_{a+1}=Sc_{a+2}=\ldots Scb)\ldots>(Sc_{K+1}=Sc_{K+2}\ldots Sc_N) \text{ where } a<b<\ldots <K<N$$

In this way, as stated in the first embodiment, the capacitance of the earliest capacitance element in a block is smaller than the capacitance of the capacitance element of the last stage of a preceding block whereby the voltage boosting speed can be increased. Although not especially restricted, with regard to the design value of the respective portions of the voltage boosting circuit of this embodiment, it is recommended that when the voltage is boosted from the power source voltage 0.9 V to 20 V, the number of stages is 24, the thickness of the oxide films of the capacitance elements is 50 nm, the number of stages in each block is 4 and with respect to the areas of the capacitance elements of the respective stage, the area of the capacitance elements of the first block is 5000 $\mu m^2$ and the area of each capacitance element in the succeeding block is the area of the capacitance element of the block preceding each block subtracted by 20% of the area of the capacitance element of the preceding block of the each block.

Further, attention is paid to the fact that the lower becomes the threshold Vthi of the above-mentioned MOSFET of i-th stage, the more boosted is the voltage boosting speed and the voltage boosting speed of the voltage boosting circuit can more be increased and the boosted voltage can be increased by determining the thresholds of the MOSFET of the respective stages to either one of the structures of the second through the eighth embodiments in addition to the structure of the above-mentioned capacitance elements of the respective stages.

Figure 17:
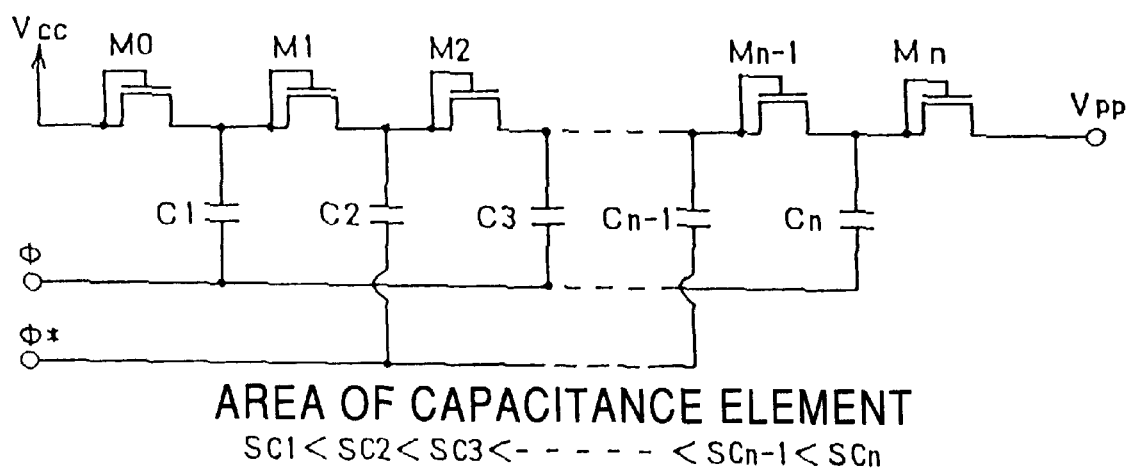
FIG. 17 is a circuit diagram of a voltage boosting circuit of an eleventh embodiment in the present invention.

FIG. 17 shows a circuit diagram of a voltage boosting circuit of an eleventh embodiment according to the present invention.

The capacitances of the capacitance elements of the respective stages are increased successively from the earlier stages to the later stages by increasing the areas SCi of the capacitance elements successively from the earlier stages to the later stages (SC1>SC2>SC3 ... >SCa-n>SCn) while maintaining constant the film thickness of the oxide films that are the insulating films of the capacitance elements at the respective stage. In this way, the voltage boosting speed can be retarded by the reason stated in the first embodiment. Although not especially restricted, with regard to the design value of the respective portions of the voltage boosting circuit in this embodiment, it is recommended that when the voltage is boosted from the power source voltage 2 V to 20 V, the number of stages is 12, the thickness of the oxide films of the capacitance elements is 50 nm and with respect to the areas of the capacitance elements of the respective stages, the area of the capacitance element at the initial stage is 1000 $\mu m^2$ and the areas of the capacitance elements at the second stage and the later stages each has a value of the area of the capacitance element of the preceding stage added with 10% of the area of the capacitance element of the preceding stage of the each stage.

Figure 18:
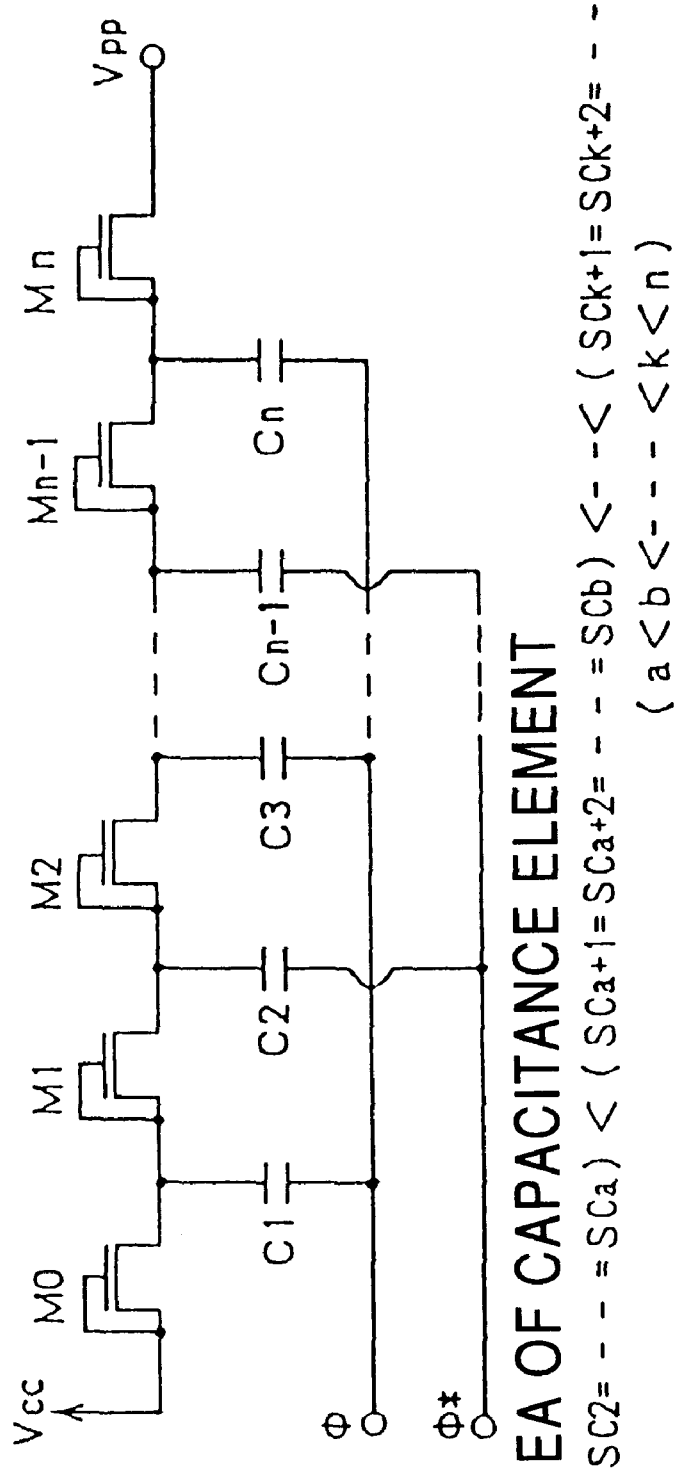
FIG. 18 is a circuit diagram of a voltage boosting circuit of a twelfth embodiment in the present invention.

FIG. 18 shows a circuit diagram of a voltage boosting circuit of a twelfth embodiment according to the present invention.

The film thickness of the oxide films that are the insulating films of the capacitance elements of the respective stages stays constant, the elements are divided into blocks each having the number of stage of 1 or more, the capacitance of the capacitance elements in a block stays the same and the capacitances of the capacitance elements in the block is increased successively as the blocks proceed to later ones. In this way, as stated in the first embodiment, the capacitance of the capacitance element at the earliest stage of a block is larger than the capacitance of the capacitance element at the last stage of a preceding block by which the voltage boosting stage can be retarded. Although not especially restricted, with regard to the design value of the respective portions of the voltage boosting circuit of this embodiment, it is recommended that when the voltage is boosted form the power source voltage 2 V to 20 V, the number of stages is 12, the thickness of the oxide films of the capacitance elements is 50 nm, the number of stages in each block is 4 and with respect to the areas of the capacitance elements at the respective stages, the area of the capacitance elements in the first block is 1000 $\mu m^2$ and with regard to the areas of the capacitance elements in the succeeding blocks, each element has a value of the area of the capacitance element of a block preceding to each block added with 20% of the area of the capacitance elements in the block preceding to the each block.

Figure 19:
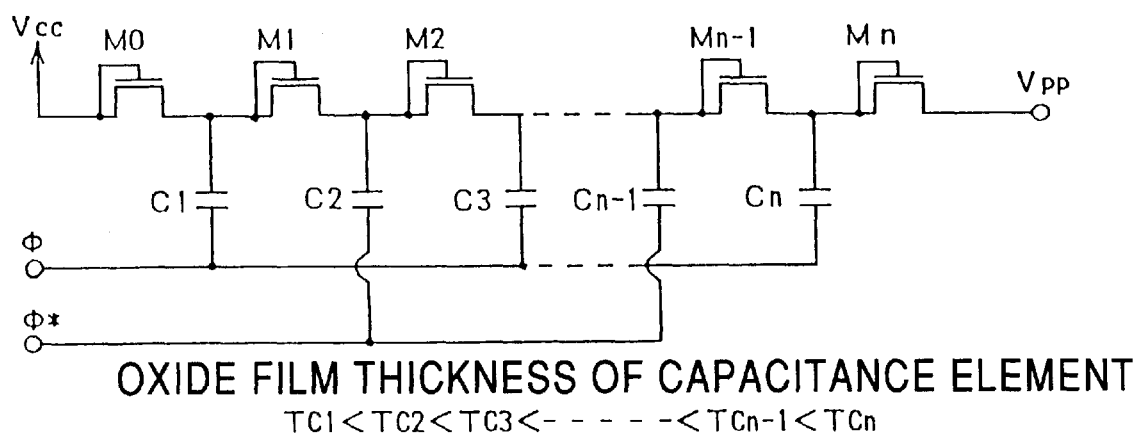
FIG. 19 is a circuit diagram of a voltage boosting circuit of a thirteenth embodiment in the present invention.

FIG. 19 shows a circuit diagram of a voltage boosting circuit of a thirteenth embodiment according to the present invention. The areas of the capacitance elements of the respective stages are fixed and the film thicknesses of Tcn of oxide films that are the insulating films of the capacitance elements are increased successively from the earlier stages to the later stages ($Tc_1<Tc_2<Tc_3 \ldots <Tc_{n-1}<Tc_n$) whereby the capacitances of the capacitance elements of the respective stages are decreased successively from the earlier stages to the later stages. In this way, the voltage boosting speed can be increased by the reason stated in the first embodiment and the voltage resistance can be enhanced more in the capacitance elements on the side of later stages wherein a high voltage is supplied between electrodes of the capacitance element. Although not especially restricted, with regard to the design value of the respective portions of the voltage boosting circuit of this embodiment, it is recommended that when the voltage is boosted from the power source voltage 1.5 V to 20 V, the number of stages is 16, the area of the capacitance elements is fixed to 3000 $\mu m^2$ and with respect to the thicknesses of the oxide films of the capacitance elements of the respective stage, the thickness of the oxide of the capacitance element at the first stage is 20 nm and with respect to the thicknesses of the oxide films of the capacitance elements at the second stage and the later stages, the film thickness is the thickness of the oxide film of the capacitance element at the preceding stage of each stage added with 10% of the thickness of the oxide film of the capacitance element at the preceding stage of the each stage.

Further, attention is paid to the fact that the lower the threshold Vthi of the MOSFET at i-th stage mentioned above, the more boosted is the voltage boosting speed and the voltage boosting speed of the voltage boosting circuit can be more increased and also the boosted voltage can be increased by determining the thresholds of the MOSFETs of the respective stages in accordance with either one stated in the second through the eighth embodiments in addition to the structure of the above-mentioned capacitance elements of the respective stage.

Figure 20:
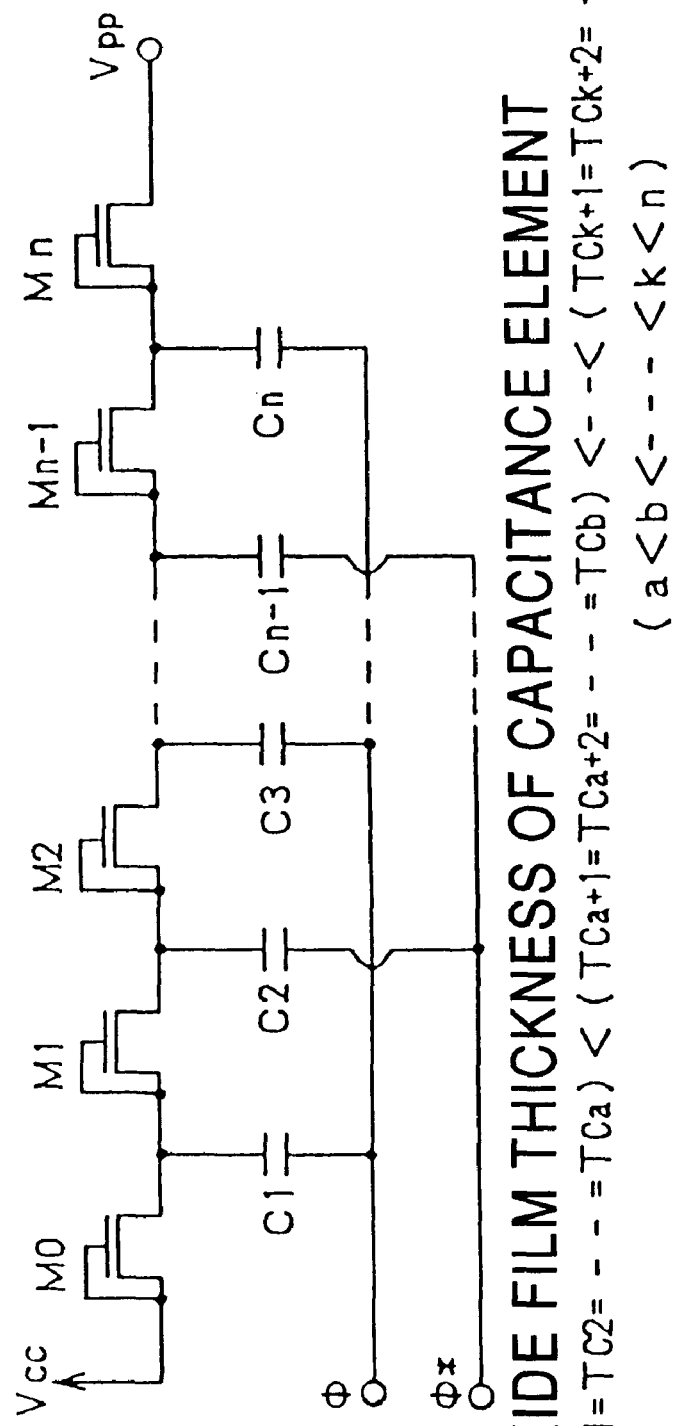
FIG. 20 is a circuit diagram of a voltage boosting circuit of a fourteenth embodiment in the present invention.

FIG. 20 shows a circuit diagram of a voltage boosting circuit of a fourteenth embodiment according to the present invention.

While the areas of the capacitance elements at the respective stages are fixed, the elements are divided into blocks each having a number of stages of 1 or more and the thickness of the oxide films of the capacitance elements in one block stays the same, the capacitances of the capacitance elements in each block can be decreased successively from the earlier blocks to the later blocks by increasing the thicknesses of Tci of the oxide films of the capacitance elements successively as the blocks proceed to the later one as shown by the following equation.

$$(Tc_1=Tc_2=\ldots=Tc_a)<(Tc_{a+1}=Tc_{a+2}=\ldots Tc_b)<\ldots(Tc_{k+1}=Tc_{k+2}=Tc_n) \text{ where } a<b<\ldots<k<N$$

In this way, as stated in the first embodiment, the capacitance of the capacitance element at the earliest stage of a block is smaller than the capacitance of the capacitance element at the last stage of a preceding block, the voltage boosting speed can be increased and the voltage resistance can be enhanced more at the capacitance elements in the later blocks wherein a high voltage is applied between thresholds of the capacitance element.

Although not especially restricted, with regard to the design value of the respective portions of the voltage boosting circuit of this embodiment, it is recommended that when the voltage is boosted from the power source voltage 1.5 V to 20 V, the number of stages is 16, the area of the capacitance elements is fixed to 3000 $\mu m^2$, the number of stages in each block is 4, and with respect to the thickness of the oxide films of the capacitance elements in the respective stages, the thickness of the oxide films of the capacitance elements in the first block is 200 nm and with respect to the thicknesses of the oxide films of the capacitance elements in the later blocks, each element has a value of the thickness of the oxide films of the capacitance elements in a preceding block of each block added with 20% of the thickness of the oxide films of the capacitance elements of the preceding block of the each block.

Further, attention is paid to the fact that the lower the threshold value Vthi of the MOSFET at i-th stage mentioned above, the more boosted is the voltage boosting speed and the voltage boosting speed of the voltage boosting circuit can more be increased and the boosted voltage can also be increased by determining the thresholds of the MOSFETs of the respective stages in accordance with either one of the second through the eighth embodiments in addition to the structures of the capacitance elements of the respective stages.

Figure 21:
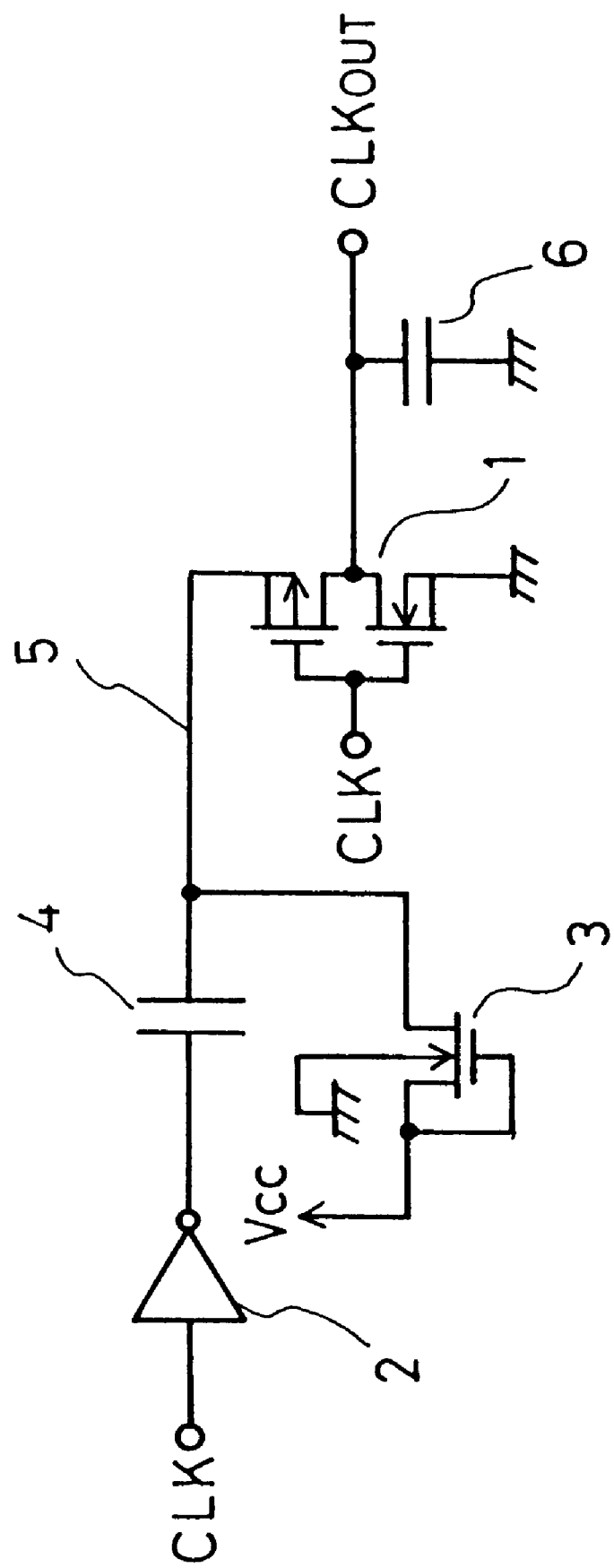
FIG. 21 is a circuit diagram of a voltage boosting circuit of a fifteenth embodiment in the present invention.

FIG. 21 shows a circuit diagram of a signal voltage boosting circuit added to a voltage boosting circuit for boosting a wave height value of a clock signal inputted to the voltage boosting circuit that is a fifteenth embodiment according to the present invention.

A power source voltage Vcc is inputted to the drain and the gate of a n-type MOSFET 3 in a diode connection, the substrate of the n-type MOSFET 3 is connected to a grounding terminal, the source is connected to a first node 5, one electrode of a capacitance element 4 is connected to the first node 5 and an output from a second inverter is connected to the other electrode of the capacitance element 4. Further, a first inverter 1 the source and the well of a P-type MOSFET of which is connected are connected to the first node 5 is provided, the same clock signal CLK having the wave height value of the power source voltage Vcc is inputted to the both inverters and a clock signal having a boosted wave height value is outputted from an output CLKout of the first inverter 1. Further, to explain the operation of the signal voltage boosting circuit in a state wherein it is connected to a voltage boosting circuit a capacitance element 6 having the capacitance C2 assuming a capacitance element of the voltage boosting circuit is added in a form wherein one electrode thereof is connected to an output CLKout of the first inverter 1 and the other electrode thereof is connected to the grounding terminal.

Figure 22:
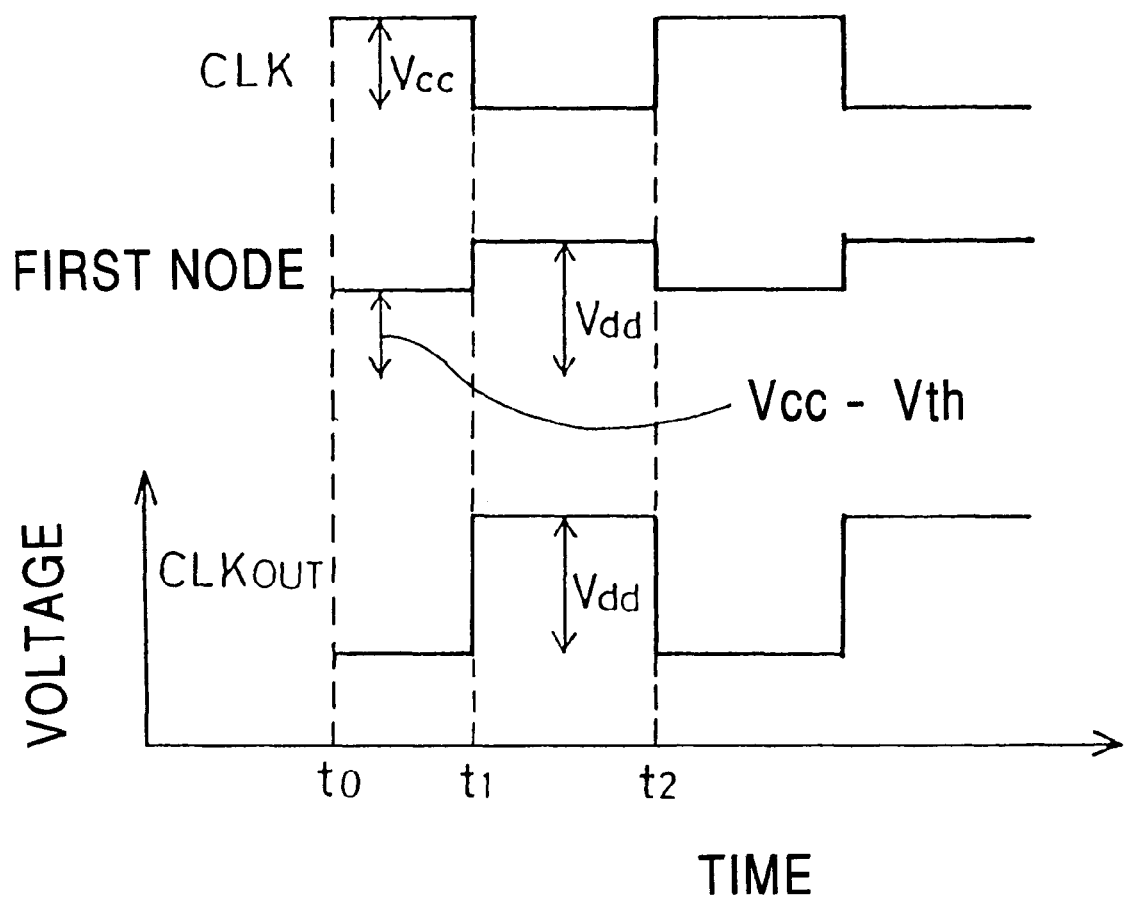
FIG. 22 illustrates timing charts showing the operation of the signal voltage boosting circuit of the fifteenth embodiment in the present invention.

Next, an explanation will be given of the operation of the signal voltage boosting circuit of this embodiment in reference to FIG. 21 and FIG. 22 illustrating timing charts.

At time point t0, the clock-signal CLK is at high level, the output CLKout of the first inverter 1 and the first node 5 are in an electrically disconnected state, both of the output CLKout of the first inverter 1 and the output of the second inverter 2 are at low level and the first node 5 is provided with a voltage having a value of the power source voltage Vcc subtracted by a threshold value Vth of the N-type MOSFET 3.

At a time point t1, the clock signal CLK is at low level, the output CLKout of the first inverter 1 and the first node 5 are in an electrically connected state, the output from the second inverter 2 is at high level and therefore, the output CLKout from the first inverter 1 and the voltage of the first node 5 are boosted up to Vdd shown by the following equation by the capacitance element 4.

$$Vdd=(2Vcc \times C1-Vth \times C1)/(C1+C2)$$

At a time point t2, the clock signal CLK is at high level and therefore, the output from the second inverter is at low level, the output CLKout from the first inverter 1 and the first node 5 are in an electrically disconnected state, electric charge (electric charge of Vdd×C2) stored in the capacitance element 6 flows to the grounding terminal via the first inverter 1 and the circuit comes back to the state of the time point T0.

The clock signal of which wave height value is boosted, is generated by repeating the above-mentioned operation from the time point t0 to the time point t2. In this explanation, the above-mentioned Vdd is the wave height value of the clock signal.

That is, by adding the signal voltage boosting circuit of this embodiment to the voltage boosting circuit the wave height value of the clock signal is boosted more than the conventional voltage boosting circuit and therefore, a high-voltage voltage boosting circuit can be provided and the voltage boosting speed can also be increased since the amount of electric charge sent to later stages by the clock signal is increased.

Further, a voltage boosting circuit wherein the boosted voltage and the voltage boosting speed are more increased by providing either one of the structures stated in the second through the tenth, the thirteenth and the fourteenth embodiments to the voltage boosting circuit to which the signal voltage boosting circuit of this embodiment is added, can be provided.

Figure 23:
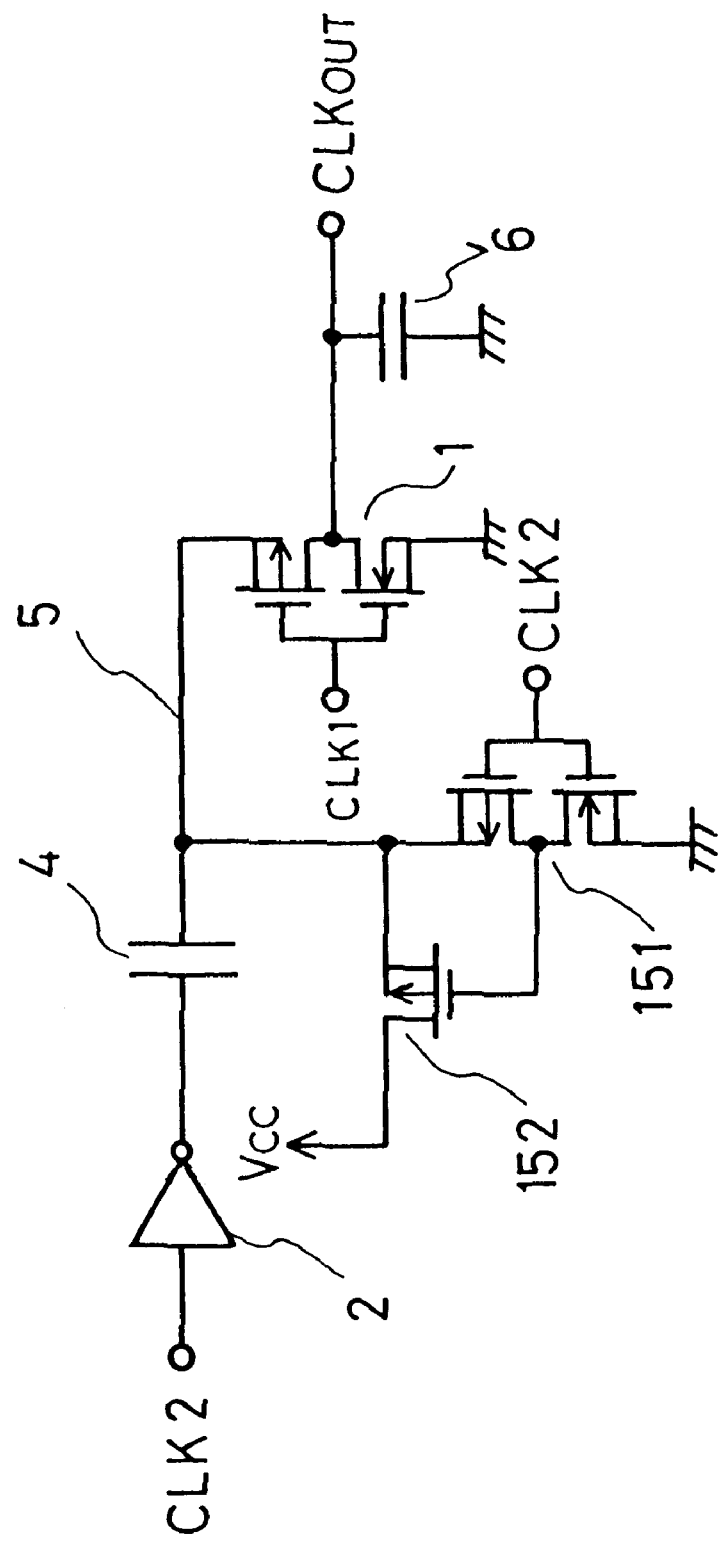
FIG. 23 is a circuit diagram of a signal voltage boosting circuit of a sixteenth embodiment in the present invention.

FIG. 23 shows a circuit diagram of a signal voltage boosting circuit added to a voltage boosting circuit to increase the wave height value of a clock signal inputted to the voltage boosting circuit that is a sixteenth embodiment according to the present invention.

As shown in FIG. 23, similar to the signal voltage boosting circuit mentioned in the fifteenth embodiment, the first inverter 1, the second inverter 2 and the capacitance element 4 having the capacitance C1 are provided, a third inverter 151 and a first P-type MOSFET 152 are provided in place of the N-type MOSFET in the signal boosting circuit of the fifteenth embodiment, in each of the first inverter 1 and the third inverter 151, the source and the well of a P-type MOSFET are connected to the first node 5 and the source and substrate of a N-type MOSFET are connected to the grounding terminal, in the second inverter 2, the source and the well of a P-type MOSFET is connected to the power source terminal Vcc and the source and substrate of a N-type MOSFET are connected to the grounding terminal, in the first P-type MOSFET 152, the source and the well are connected to the first node 5 and the drain is connected to the power source terminal Vcc, respectively. Further, the output of the third inverter 151 is connected to the gate of the first P-type MOSFET 152, the output of the second inverter 2 is connected to one electrode of the capacitance element 4 and the other electrode of the capacitance element 4 is connected to the first node 5. To explain the operation of the signal voltage boosting circuit of this embodiment in a state wherein a capacitance element of a voltage boosting circuit is connected thereto as in the signal voltage boosting circuit stated in the fifteenth embodiment, in the capacitance element 6 having the capacitance C2 assuming the capacitance of a capacitance element of the voltage boosting circuit, one electrode of the capacitance element 6 is connected to the output CLKout of the first inverter and the other electrode is connected to the grounding terminal. Clock signals CLK1 and CLK2 of which wave height values is the power source voltage are respectively inputted to the first inverter 1, and the third inverter 151 and the second inverter 2 and a clock signal of which wave height value is boosted is outputted from the output CLKout of the first inverter 1. Here, although the clock signals inputted to the third inverter 151 and the second inverter 2 are equal to each other, different clock signals may respectively be inputted thereto if a condition wherein, when the clock signal inputted to the second inverter 2 is at low level, the clock signal inputted to the inverter 151 is always at low level, is satisfied.

Figure 24:
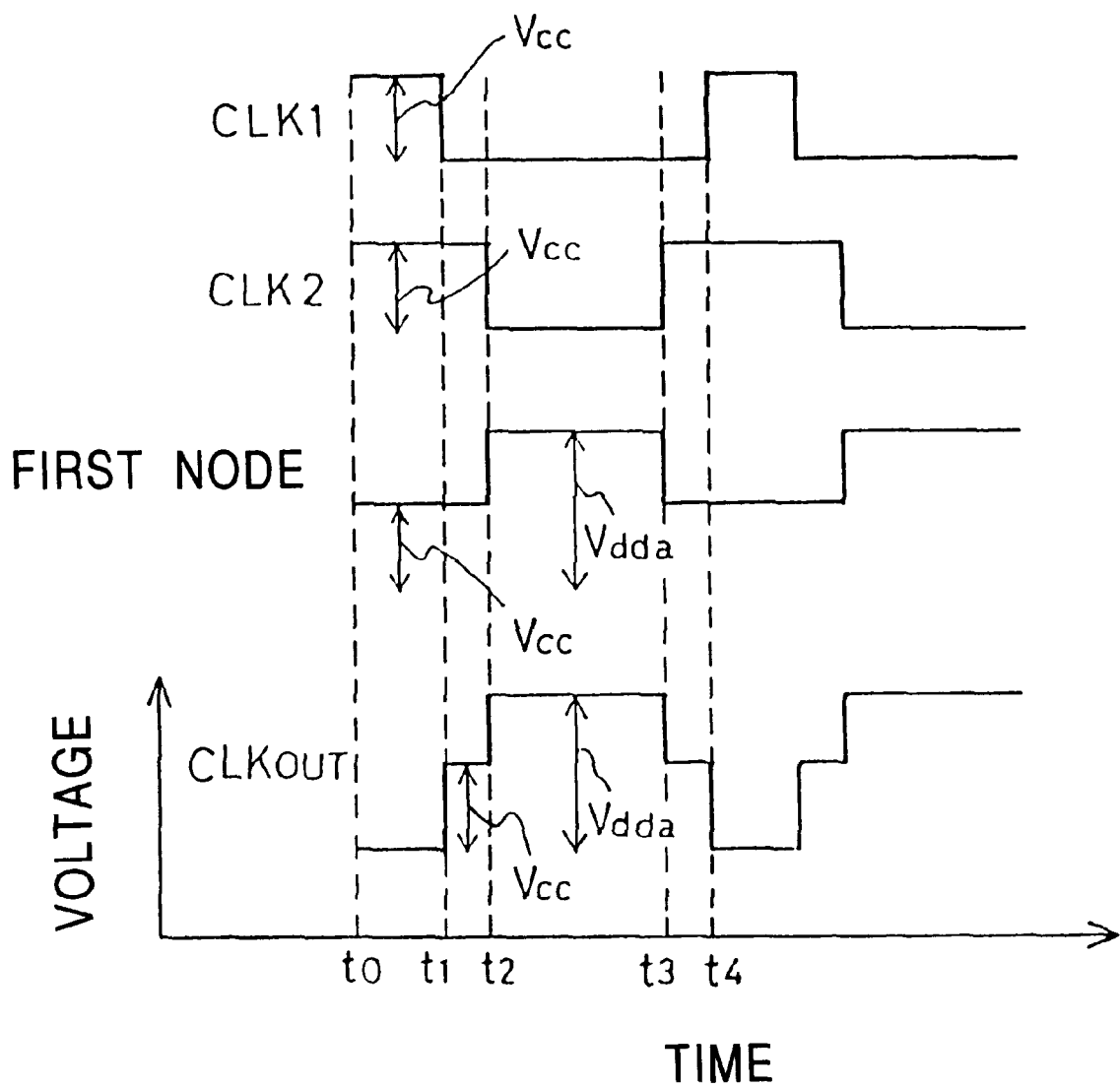
FIG. 24 illustrates timing charts showing the operation of the signal voltage boosting circuit of the sixteenth embodiment in the present invention.

Next, an explanation will be given of the operation of this embodiment in reference to FIG. 24 illustrating timing charts showing the operation of this embodiment.

At a time point t0, both of the clock signals CLK1 and CLK2 are at high level, both of the output CLKout of the first inverter 1 and the output from the third inverter 151 are at low level and also the output of the second inverter 2 is at low level. Therefore, the voltage of the first node 5 becomes the power source voltage Vcc since the first P-type MOSFET 152 becomes a low impedance.

At a time point t1, CLK1 is at low level while CLK2 remains at high level and the output CLKout from the first inverter 1 becomes the power source voltage Vcc.

At a time point t2, CLK2 is at low level while CLK1 remains at low level and therefore, both of the output from the second inverter 2 and the output from the third inverter 151 are at high level and therefore, the first P-type MOSFET 152 becomes a high impedance. Accordingly, the output CLKout of the first node 5 and the first inverter 1 is boosted to Vdda shown by the following equation by the capacitance element 4.

$$Vdda=(2Vcc \times C1+Vcc \times C2)/(C1+C2)$$

At a time point t3, CLK2 is at high level while CLK1 remains at low level and therefore, both of the output of the third inverter 151 and the output of the second inverter 2 are at low level and the voltage of the first node 5 is lowered to the power source voltage Vcc. Therefore, a portion of electric charge (Vdda−Vcc)*C2 of the total electric charge stored in the capacitance element 6 corresponding to a capacitance element of the voltage boosting circuit, reversely flows to the first node 5 via the first inverter 1 and the output CLKout of the first inverter 1 becomes the power source voltage Vcc.

Further, at a time point t4, CLK1 is at high level while CLK2 remains at high level and therefore, electric charge (Vcc×C2) stored in the capacitance element 6 corresponding to a capacitance element of the voltage boosting circuit at the output of the first inverter 1, flows to the grounding terminal, the output CLKout of the first inverter 1 is at low level and the circuit comes back to the state of the time point t0.

That is, the clock signal of which wave height value is boosted is generated by repeating the operation between the time point t0 and the time point t4. In this explanation, the above-mentioned Vdda is the wave height value of the clock signal outputted from the signal voltage boosting circuit of this embodiment.

As stated above, the wave height value Vdda of the clock signal outputted form the signal voltage boosting circuit of this embodiment is larger than the wave height value Vdd of the signal boosting circuit of the fifteenth embodiment by Va specified by the following equation.

$$Va=(Vcc \times C2+Vth \times C1)/(C1+C2)$$

With regard to consumed current or the amount of current flowing from the capacitance element 6 having the capacitance C2 assuming a capacitance element of the voltage boosting circuit to the grounding terminal via the first inverter 1 in the signal voltage boosting circuit of this embodiment is lower than that of the signal voltage boosting circuit of the fifteenth embodiment by Ia specified by the following equation.

$$Ia=(Vdd-Vcc) \times C2 \times f$$

where a notation f designates a frequency of the clock signal outputted from the signal voltage boosting circuits of the fifteenth embodiment and this embodiment.

It will be appreciated that a voltage boosting circuit having a higher boosted voltage and a faster voltage boosting speed than the conventional voltage boosting circuit is provided by adding the signal voltage boosting circuit of this embodiment to the voltage boosting circuit. Moreover, a voltage boosting circuit having a higher boosted voltage and a lower consumed current than the voltage boosting circuit to which the signal voltage boosting circuit of the fifteenth embodiment is added, can be provided and further, the wave height value of the clock signal inputted to the voltage boosting circuit becomes higher and the amount of electric charge transferred to the later stages is increased by which the voltage boosting speed can be increased.

Further, a voltage boosting circuit of which boosted voltage and voltage boosting speed are further increased by providing either one of the structures mentioned in the second through tenth, the thirteenth and the fourteenth embodiments to the voltage boosting circuit to which the signal voltage boosting circuit of this embodiment is added, can be provided.

Figure 25:
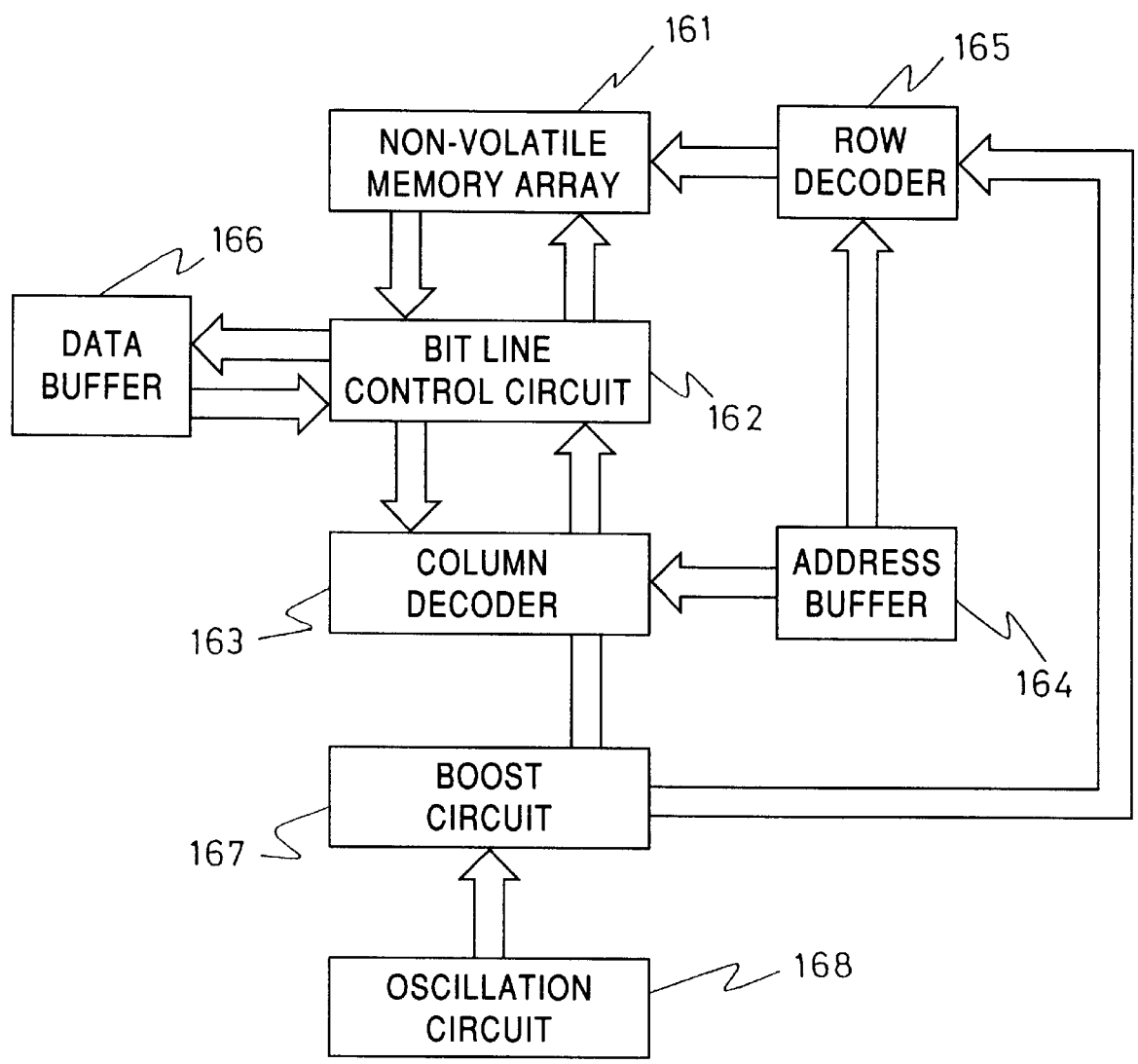
FIG. 25 is a simple block diagram of a semiconductor integrated circuit device having an unvolatile memory element in a seventeenth embodiment of the present invention.

FIG. 25 shows a simple block diagram of a semiconductor integrated circuit device having an unvolatile memory element which are a seventeenth embodiment according to the present invention.

A bit line control circuit 162 for writing and reading data is provided to an unvolatile memory element array 161 as a memory means. The bit line control circuit 162 is connected to a data buffer 166 and receives an output from a column decoder 163 which receives an address signal from an address buffer 164. Further, a row decorder 165 is provided to the unvolatile memory element array 161 for controlling a control gate and a select gate. A voltage boosting circuit 167 supplies an boosted voltage that is generated by receiving a drive signal from an oscillating circuit 168 to the bit line control circuit 162 and the low decorder 165 in writing and erasing operations of the unvolatile memory element array 161. In this embodiment, when the power source voltage is low (for example 0.9 V), the boosted voltage (20 V or more) necessary for rewriting the unvolatile memory element can be provided even if the power source voltage is low by providing either one of the structures mentioned in the second through the eighth, the fifteenth and the sixteenth embodiments to the voltage boosting circuit 167. That is, even when the power source voltage is low, the semiconductor integrated circuit device sufficiently capable of rewriting can be realized and when the power source voltage is lowered (for example 1.2 V), the rewriting speed of the unvolatile memory element is accelerated even if the power source voltage is lowered by providing either one of structures mentioned in the ninth, the tenth, the thirteenth and the fourteenth embodiments to the circuit. That is, the semiconductor integrated circuit device having a fast operational speed can be realized. Further, the semiconductor integrated circuit having a long life can be realized at a low cost since the voltage boosting speed can be retarded without a circuit having a function of retarding the voltage boosting speed even when the power source voltage is high by providing either one of the structures mentioned in the eleventh and the twelfth embodiments to the voltage boosting circuit 167.

Although not especially restricted, with regard to the design value of various portions of the voltage boosting circuit 167 in the respective embodiments when the voltage boosting circuit 167 is provided with structures mentioned in the respective above-mentioned embodiments, it is recommended to adopt the design value recommended in the respective embodiments.

Figure 26:
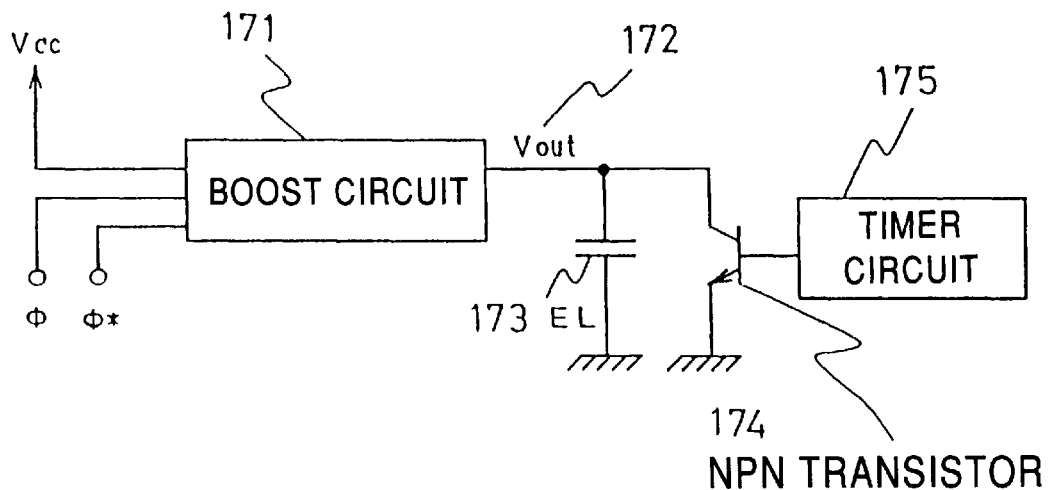
FIG. 26 is a simple block diagram of an electronic apparatus having a light emitting apparatus including a power source, a voltage boosting circuit for boosting the power source voltage and an EL in an eighteenth embodiment of the present invention.

FIG. 26 shows a schematic block diagram of an electronic apparatus having a light emitting apparatus comprising a power source, a voltage boosting circuit 171 for boosting the power source voltage and an electroluminescence element 173 (hereinafter, EL) which is an eighteenth embodiment according to the present invention.

One electrode of the EL 173 is connected to the grounding terminal and the voltage of the other electrode is boosted by the voltage boosting circuit 171, and the boosted voltage is swiftly lowered to a value proximate to the voltage of the grounding terminal by a NPN transistor 174. The EL 173 emits light when the voltage is boosted and when the boosted voltage is swiftly lowered to the value proximate to the voltage of the grounding terminal. That is, its brightness is provided by repeating the light emittance. Further, the speed of repeating the light emittance is controlled by a timer circuit 175.

In a conventional electronic apparatus, the boosted voltage applied on the EL 173 is generated by a coil system and, therefore, it cannot be formed thin due to the thickness of a coil portion. However, in this embodiment, the boosted voltage is generated by the voltage boosting circuit 171 formed on a thin semiconductor substrate and therefore, an electronic apparatus that is thinner than the conventional one can be realized.

Further, the shorter a light emitting interval of the EL 173 and the higher the provided bright boosted voltage, the more increased is the brightness of the EL 173 of the electronic apparatus of this embodiment. That is, the brightness of the EL 173 is increased when the time period in which the voltage from the voltage boosting circuit 171 is increased to a voltage necessary for the light emittance of the EL 173, can be shortened and the light emitting interval can be shortened, and the higher the voltage applied for emitting light, the more can the voltage be increased. Accordingly, a high boosted voltage can be applied on the EL 173 in a short period of time and the electronic apparatus of a thin-type capable of generating a sufficient brightness can be realized by providing either one of the structures mentioned in the second through the tenth, the thirteenth through the sixteenth embodiments to the voltage boosting circuit 171 of the electronic apparatus in this embodiment.

Although not especially restricted, with regard to the number of steps and the average value of the total capacitance elements when the voltage boosting circuit 171 of this embodiment is constituted as mentioned above, since a sufficient brightness can be provided when the EL 173 has the capacitance of several nF, the voltage lowering frequency by the timer circuit 175 is approximately 256 Hz and a voltage boosting speed capable of supplying an boosted voltage of approximately 100 V to Vout 172 during the period is provided, assuming the power supply voltage Vcc of 3 V and the frequency of the clock signal of 3 MHz, it is recommended that the number of all the steps is 40 and the average value of the capacitances of the capacitance elements of all the stages is 100 pF in cases other than cases wherein the structures mentioned in the fifteenth and the sixteenth embodiments are adopted, it is recommended that the number of steps is 25 and the average value of the capacitances of the capacitance elements of all the stages is 60 pF in cases of adopting the structures mentioned in the fifteenth and the sixteenth embodiments and it is recommended that the setting of other component elements are the settings mentioned in the respective embodiments.

Figure 27:
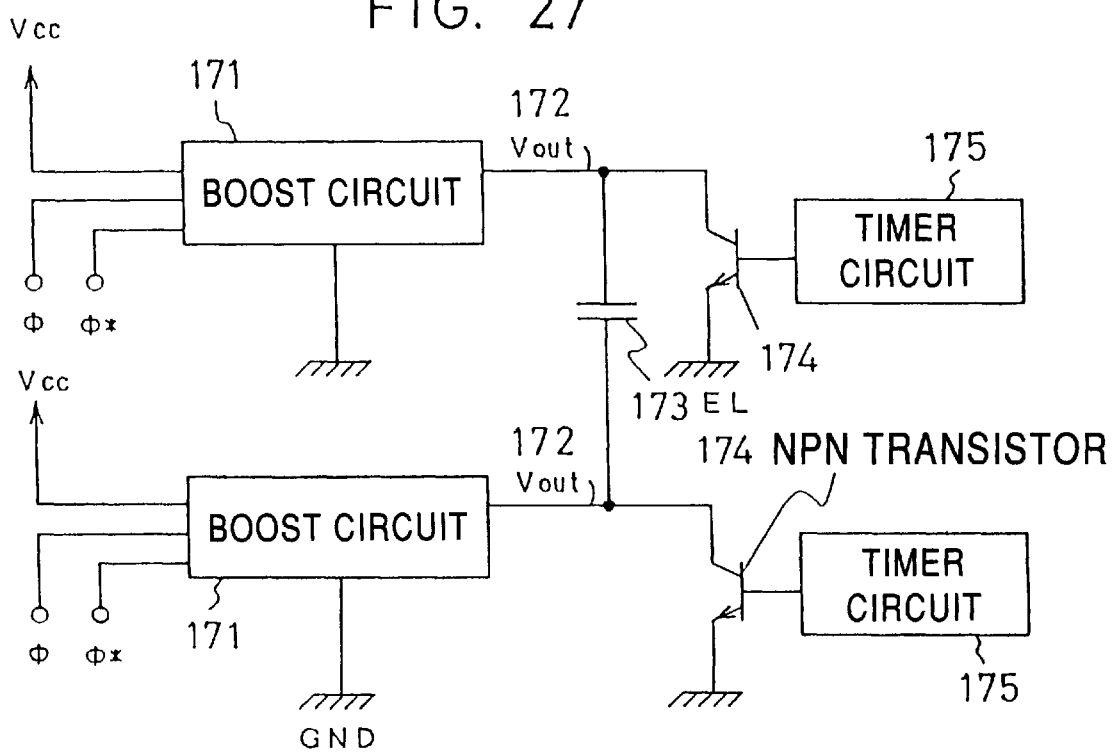
FIG. 27 is a simple block diagram of an electronic apparatus having a light emitting apparatus including a power source, a voltage boosting circuit for boosting the power source voltage and an EL in an nineteenth embodiment of the present invention.
Figure 28:
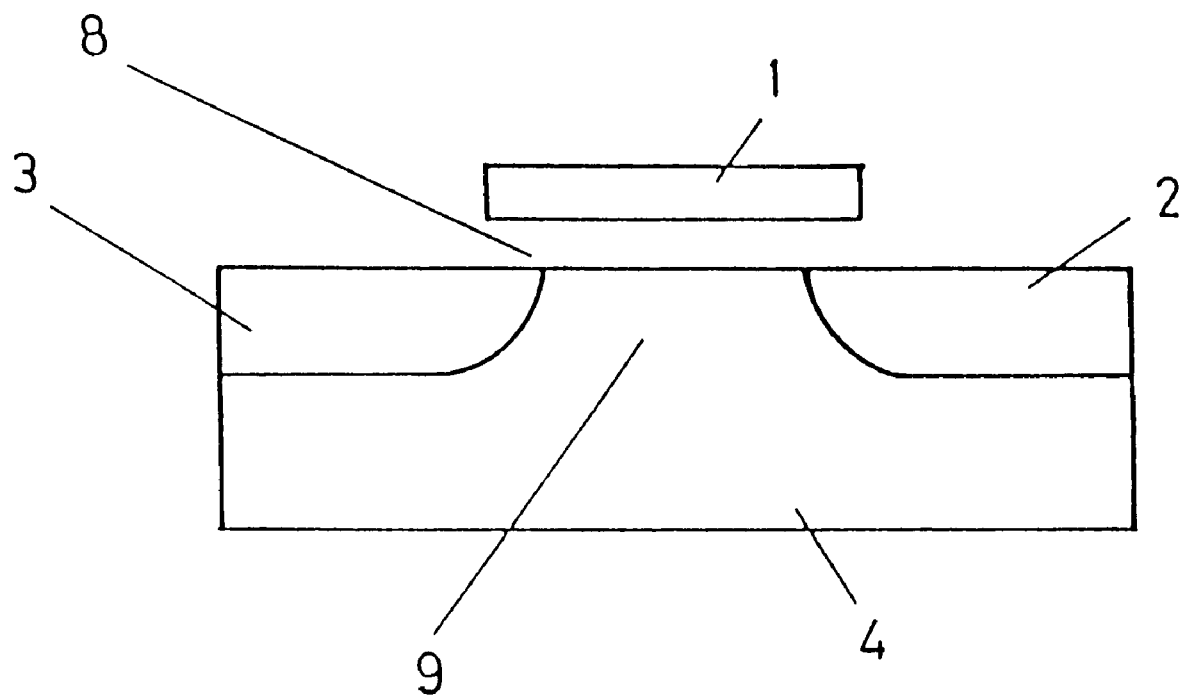
FIG. 28 is a schematic sectional view of a conventional MOSFET.

FIG. 27 shows a schematic block diagram of the electronic apparatus that is a nineteenth embodiment according to the present invention.

The voltage boosting circuits 171 for boosting the voltage of the one-side electrode of the EL 173 and swiftly lowering the boosted voltage to a value proximate to the voltage of the grounding terminal, the NPN transistors 174 and the timer circuits 175 in the eighteenth embodiment, are respectively provided at the both sides of the electrodes of the EL 173, the voltages at the both sides of the electrodes of the EL 173 are boosted and the boosted voltages are swiftly lowered to a value proximate to the grounding terminal. Timings of the above-mentioned operation performed on the both electrodes of the EL 173 are shifted from each other just by a half frequency and while the boosted voltage at one electrode is being swiftly lowered to a value proximate to the voltage of the grounding terminal, the voltage of the other electrode is boosted. In this way, a comparable brightness can be provided when the voltage boosted by the respective voltage boosting circuits 171 at the both electrodes of the EL 173 is approximately 50 V. That is, the voltage of approximately 50 V is a voltage which can be boosted by the respective voltage boosting circuits 171 even if the power source voltage Vcc is low (for example 2 V) and therefore, the electronic apparatus of a thin-type providing the comparative brightness even in case where the power source voltage Vcc is low (for example 2 V) can be realized.

Further, as stated in the eighteenth embodiment, also in this embodiment, the shorter the light emitting interval of the EL 173 and the higher the applied boosted voltage, the more increased is the brightness of the EL 173. That is, the brightness of the EL 173 is increased if the period of time for boosting the voltage necessary for the light emittance of the EL 173 is shortened and the light emitting interval can be shortened and the higher the voltage applied for the light emittance, the more increased is the brightness. Accordingly, as stated in the eighteenth embodiment, a high boosted voltage can be applied on the EL 173 in a short period of time and the electronic apparatus of a thin-type capable of generating a sufficient brightness even when the power source voltage is low (for example 2 V) can be realized by providing either one of the structures mentioned in the second through the tenth and the thirteenth through sixteenth embodiments to the voltage boosting circuit 171 of the electronic apparatus of this embodiment.

Although not especially restricted, with regard to the number of steps and the average value of all the capacitance elements when the voltage boosting circuit 171 of this embodiment is provided with the above-mentioned structure, since a comparable brightness can be provided when the EL 173 is provided with the capacitance of several nF, the voltage lowering frequency by the timer circuits 175 is approximately 256 Hz and the voltage boosting speed capable of supplying the boosted voltage of 50 V or more to Vout 172 during that period is provided, assuming the power source voltage Vcc of 1.5 V and the frequency of the clock signal of 3 MHz, it is recommended that the number of all the steps is 40 and the average value of the capacitances of the capacitance elements of all the steps is 100 pF in cases other than cases wherein the structures mentioned in the fifteenth and the sixteenth embodiments are adopted, it is recommended that the number of steps is 25 and the average value of the capacitances of the capacitance elements of all the steps is 60 pF in cases wherein the structures mentioned in the fifteenth and the sixteenth embodiments are adopted and it is recommended that the setting of the other component elements are the settings mentioned in the respective embodiments.

As stated above, the present invention has the following effects. That is, the semiconductor integrated circuit device capable of performing at a low voltage, which has been impossible to perform, or at a high-speed operation by using the voltage boosting circuit of the present invention in a semiconductor integrated circuit device necessitating a voltage boosted from a power source voltage, such as a semiconductor integrated circuit device having an electrically rewritable unvolatile memory element, can be provided.

Further, the electric apparatus of a thin-type having high brightness which has been impossible to provide can be realized by utilizing the voltage boosting circuit of the present invention in an electronic apparatus having a light emitting apparatus utilizing the light emittance of a EL necessitating a high boosted voltage.

What is claimed is:

1. A semiconductor integrated circuit device comprising: a first MISFET and a second MISFET both formed on a semiconductor substrate and connected in series in a diode connection, each of the first and second MISFETs having a source, a drain, a channel disposed between the source and the drain, and a gate disposed over the channel through a gate insulating film, the first MISFET having a first threshold voltage, and the second MISFET having a second threshold voltage lower than the first threshold voltage; wherein a portion of the semiconductor substrate at the channel region of each of the MISFETs has an impurity concentration equal to or less than $6 \times 10^{14}$ atoms/cc.

2. A semiconductor integrated circuit device comprising: a first MISFET and a second MISFET both formed on a semiconductor substrate and connected in series in a diode connection, each of the first and second MISFETs having a source, a drain, a channel disposed between the source and the drain, and a gate disposed over the channel through a gate insulating film, the first MISFET having a first threshold voltage, and the second MISFET having a second threshold voltage lower than the first threshold voltage; wherein the drain and the gate of the first MISFET are connected to a first node, the drain and the gate of the second MISFET are connected to a second node, the source of the first MISFET is connected to the second node, a first input signal having a first phase is inputted to the first node via a capacitance element, a second input signal having a second phase different from the first phase of the first input signal is inputted to the second node via a capacitance element, and an input voltage applied to the first node is outputted from the source of the second MISFET after boosting the first input voltage.

3. A semiconductor integrated circuit device comprising: a first MISFET and a second MISFET both formed on a semiconductor substrate and connected in series in a diode connection, each of the first and second MISFETs having a source, a drain, a channel disposed between the source and the drain, and a gate disposed over the channel through a gate insulating film, the first MISFET having a first threshold voltage, and the second MISFET having a second threshold voltage lower than the first threshold voltage; wherein a first impurity concentration at a portion of the semiconductor substrate between the source and the drain of the first MISFET is higher than a second impurity concentration at a portion of the semiconductor substrate between the source and the drain of the second MISFET.

4. A semiconductor integrated circuit device comprising: a first MISFET and a second MISFET both formed on a semiconductor substrate and connected in series in a diode connection, each of the first and second MISFETs having a source, a drain, a channel disposed between the source and the drain, and a gate disposed over the channel through a gate insulating film, the first MISFET having a first threshold voltage, and the second MISFET having a second threshold voltage lower than the first threshold voltage; wherein a length of the channel of the first MISFET is larger than a length of the channel of the second MISFET.

5. A semiconductor integrated circuit device comprising: a first MISFET and a second MISFET both formed on a semiconductor substrate and connected in series in a diode connection, each of the first and second MISFETs having a source, a drain, a channel disposed between the source and the drain, and a gate disposed over the channel through a gate insulating film, the first MISFET having a first threshold voltage, and the second MISFET having a second threshold voltage lower than the first threshold voltage; wherein the gate insulating film of each of the first and second MISFETs comprises a first gate insulating film having a first thickness and a second gate insulating film having a second thickness smaller than the first thickness, the first gate insulating film and the second gate insulating film of each of the first and second MISFETs extending in a length direction of the channel of the first MISFET and the second MISFET, respectively, and a channel length of a total of the channel prescribed by the first gate insulating film of the first MISFET is shorter than a channel length of a total of the channel prescribed by the first gate insulating film of the second MISFET.

6. A semiconductor integrated circuit device comprising: a first MISFET and a second MISFET both formed on a semiconductor substrate and connected in series in a diode connection, each of the first and second MISFETs having a source, a drain, a channel disposed between the source and the drain, and a gate disposed over the channel through a gate insulating film, the first MISFET having a first threshold voltage, and the second MISFET having a second threshold voltage lower than the first threshold voltage; wherein the gate insulating film of each of the first and the second MISFETs comprises a first gate insulating film having a first thickness and a second gate insulating film having a second thickness smaller than the first thickness, the first gate insulating film and the second gate insulating film of each of the first and second MISFETs extending in a length direction of the channel of the first MISFET and the second MISFET, respectively, and a first channel length of a total of the channel prescribed by the second gate insulating film of the first MISFET is larger than a second channel length of a total of the channel prescribed by the second gate insulating film of the second MISFET.

7. A semiconductor integrated circuit device according to claim 5; wherein the gate comprises a first gate disposed on the first gate insulating film; and further comprising a second gate disposed on the second gate insulating film, the first and second gates being formed separately and independently from each other.

8. A semiconductor integrated circuit device having a voltage boosting circuit, comprising: a plurality of MISFETs connected together in a diode connection, each of the MISFETs being formed on a semiconductor substrate and having a source, a drain and a channel region disposed between the source and the drain, a portion of the semiconductor substrate at the channel region having an impurity concentration equal to or less than $6 \times 10^{14}$ atoms/cc.

9. A semiconductor integrated circuit device comprising: at least two MISFETs formed on a semiconductor substrate and connected in series in a diode connection, each of the MISFETs having a source, a drain, a channel extending between the source and the drain, a first gate insulating film disposed over the channel, a first gate formed over the first gate insulating film, a second gate insulating film disposed over the channel, and a second gate disposed over the second gate insulating film and formed separately and independently from the first gate, the first gate insulating film having a thickness greater than a thickness of the second gate insulating film.

* * * * *